(12) United States Patent
Nakamura et al.

(10) Patent No.: US 10,553,629 B2
(45) Date of Patent: Feb. 4, 2020

(54) SOLID-STATE IMAGE PICKUP DEVICE, METHOD OF MANUFACTURING SOLID-STATE IMAGE PICKUP DEVICE, AND ELECTRONIC APPARATUS

(71) Applicant: SONY CORPORATION, Tokyo (JP)

(72) Inventors: Ryosuke Nakamura, Kanagawa (JP); Fumihiko Koga, Kanagawa (JP); Taiichiro Watanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 3 days.

(21) Appl. No.: 15/448,247

(22) Filed: Mar. 2, 2017

(65) Prior Publication Data

US 2017/0243906 A1 Aug. 24, 2017

Related U.S. Application Data

(63) Continuation of application No. 15/087,733, filed on Mar. 31, 2016, now Pat. No. 9,634,047, which is a continuation of application No. 14/889,552, filed as application No. PCT/JP2014/002458 on May 9, 2014, now Pat. No. 9,620,539.

(30) Foreign Application Priority Data

May 16, 2013 (JP) ................................ 2013-104000

(51) Int. Cl.
*H01L 27/146* (2006.01)
*G01J 1/44* (2006.01)

(52) U.S. Cl.
CPC .......... *H01L 27/14614* (2013.01); *G01J 1/44* (2013.01); *H01L 27/1461* (2013.01); *H01L 27/1464* (2013.01); *H01L 27/14605* (2013.01); *H01L 27/14612* (2013.01); *H01L 27/14621* (2013.01); *H01L 27/14627* (2013.01); *H01L 27/14636* (2013.01); *H01L 27/14638* (2013.01); *H01L 27/14641* (2013.01); *H01L 27/14643* (2013.01); *H01L 27/14645* (2013.01);

(Continued)

(58) Field of Classification Search
CPC ......... H01L 27/14614; H01L 27/14647; H01L 27/14621; H01L 27/14627; H01L 27/14605; H01L 27/14636; H01L 27/14645; H01L 27/1461; H01L 27/14643; H01L 27/14689; H01L 27/14641; H01L 27/14612; G01J 1/44
See application file for complete search history.

(56) References Cited

FOREIGN PATENT DOCUMENTS

| CN | 102693989 | 9/2006 |
|---|---|---|
| CN | 101609837 | 12/2009 |

(Continued)

OTHER PUBLICATIONS

Official Action (no English translation available) for Japanese Patent Application No. 2013-104000 dated May 2, 2017, 8 pages.

(Continued)

*Primary Examiner* — Tony Ko
(74) *Attorney, Agent, or Firm* — Sheridan Ross P.C.

(57) ABSTRACT

There is provided a solid-state image pickup device including: a semiconductor substrate; a photodiode formed in the semiconductor substrate; a transistor having a gate electrode part or all of which is embedded in the semiconductor substrate, the transistor being configured to read a signal electric charge from the photodiode via the gate electrode; and an electric charge transfer layer provided between the gate electrode and the photodiode.

31 Claims, 19 Drawing Sheets

(52) U.S. Cl.
CPC .. *H01L 27/14647* (2013.01); *H01L 27/14689* (2013.01); *G01J 2001/448* (2013.01)

(56) References Cited

FOREIGN PATENT DOCUMENTS

| | | |
|---|---|---|
| JP | 2010-114274 | 5/2010 |
| JP | 2010-114324 | 5/2010 |
| JP | 2012-199489 | 10/2012 |
| JP | 2013-021169 | 1/2013 |
| JP | 2013-041875 | 2/2013 |

OTHER PUBLICATIONS

Official Action (w English translation) for Chinese Patent Application No. 2017-10051033.2 dated Oct. 17, 2017, 20 pages.
Official Action (with English translation) for Chinese Patent Application No. 201480011582.1 dated Jan. 2, 2018 15 pages.
Official Action (no English translation available) for Japanese Patent Application No. 2013-104000 dated Jan. 31, 2017, 21 pages.

[FIG. 1]
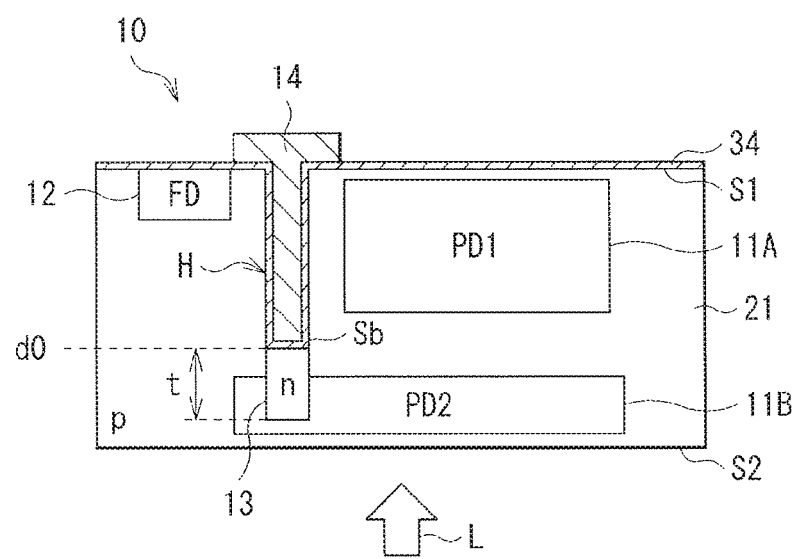

[ FIG. 2A ]
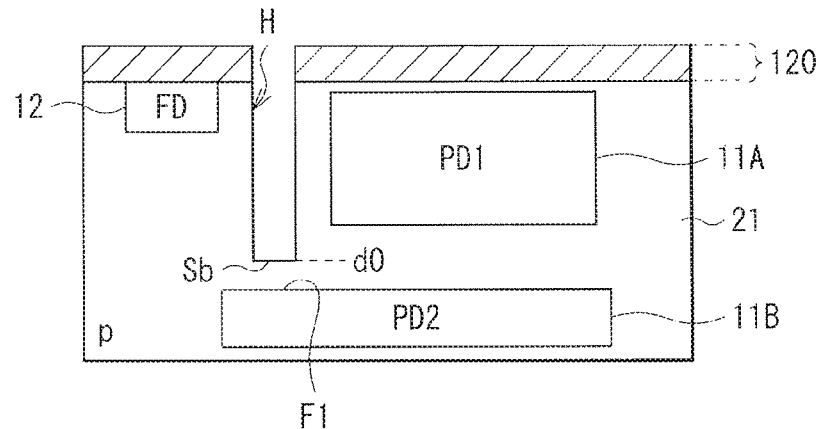
[ FIG. 2B ]
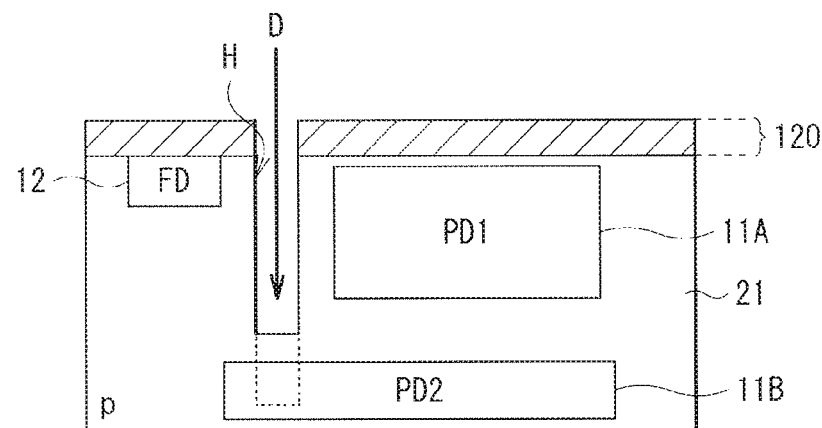
[ FIG. 2C ]
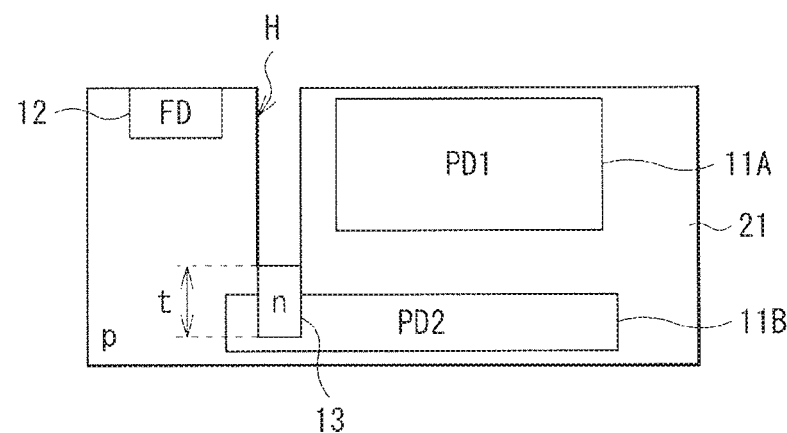

[ FIG. 2D ]
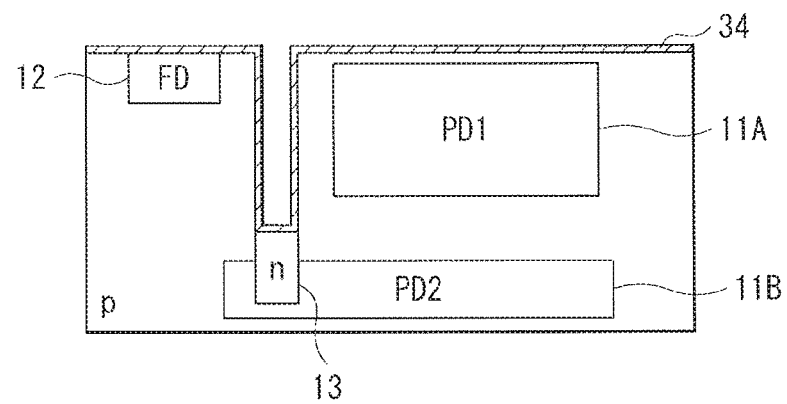
[ FIG. 2E ]
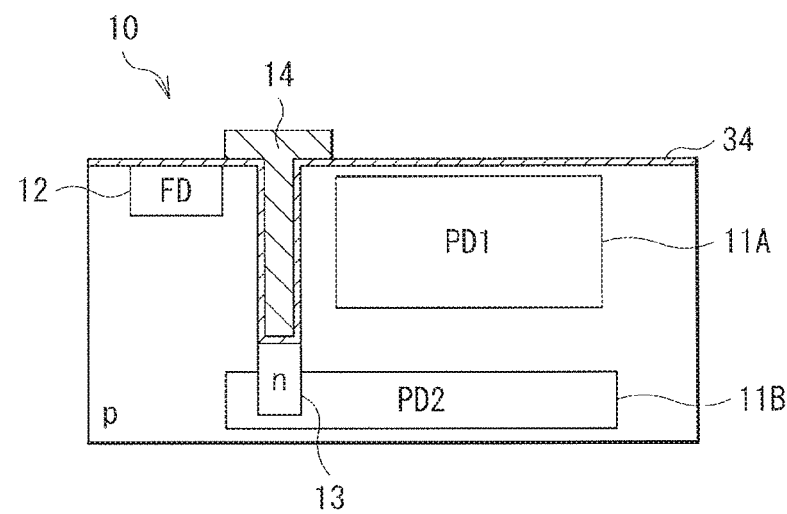

[ FIG. 3A ]
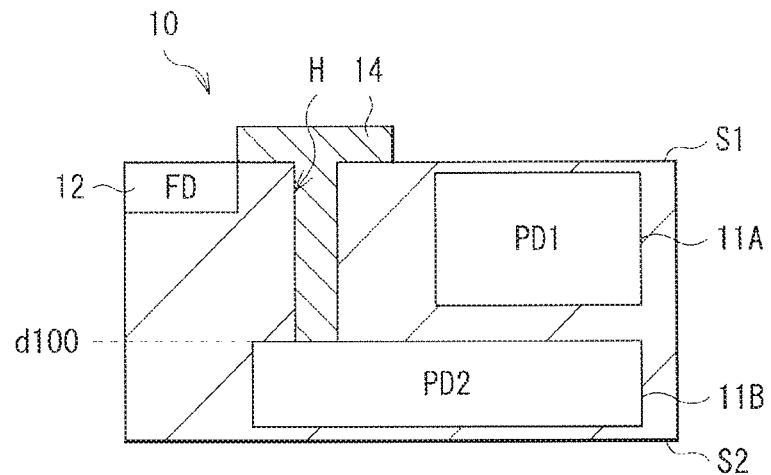
[ FIG. 3B ]
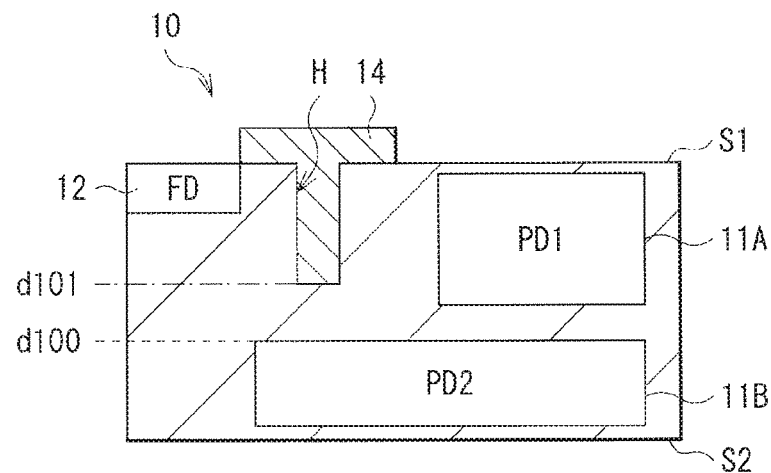
[ FIG. 3C ]
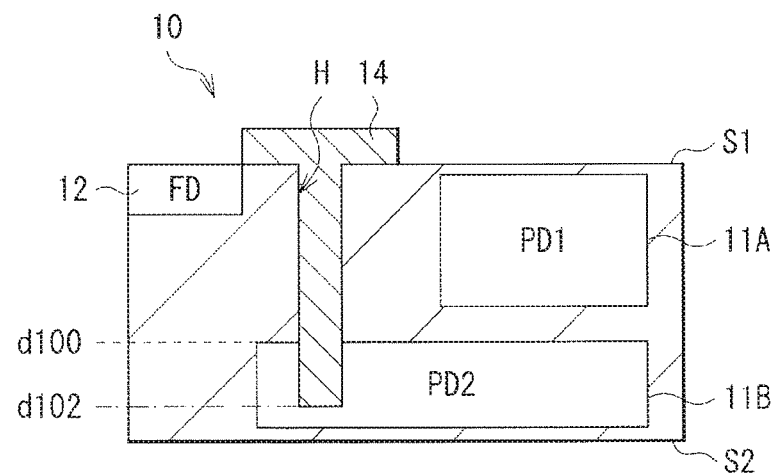

[ FIG. 4A ]
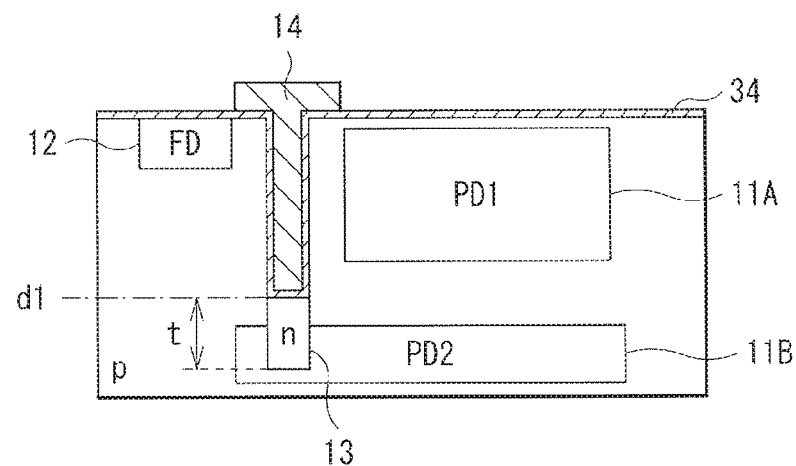
[ FIG. 4B ]
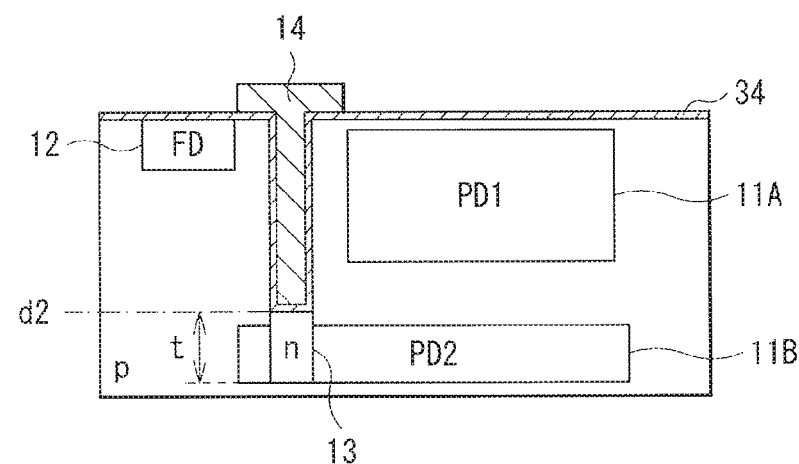

[FIG. 5]
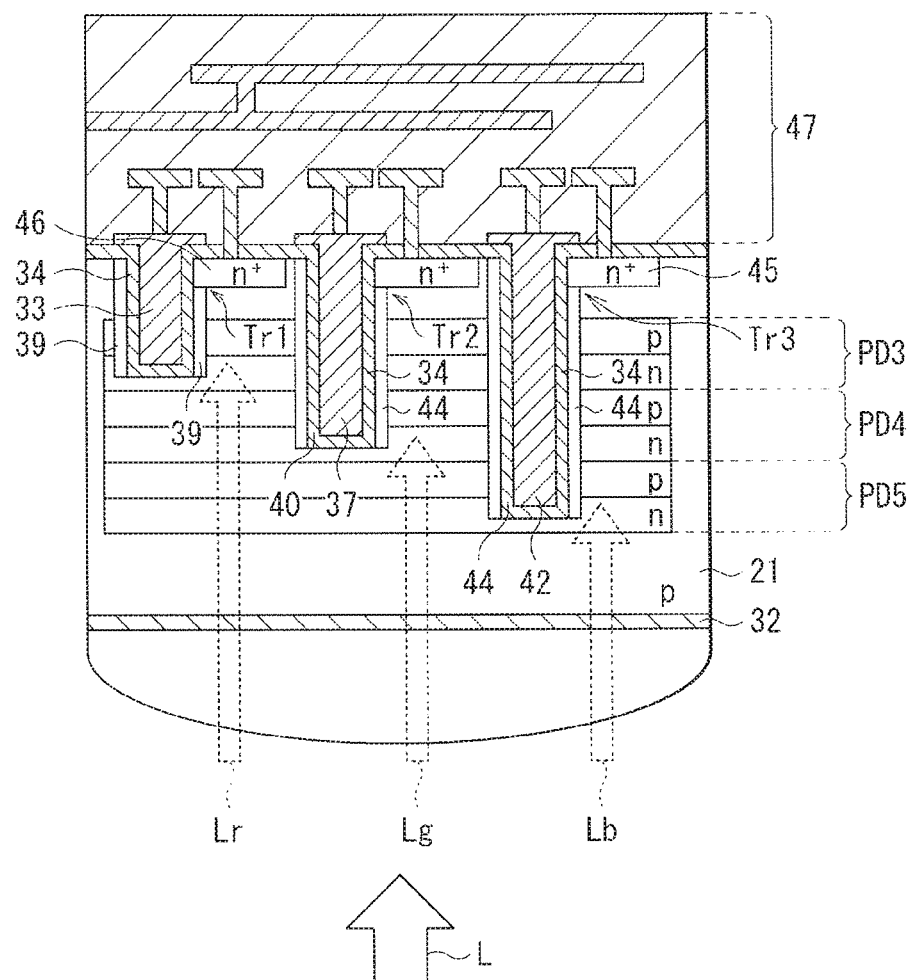

[ FIG. 6 ]
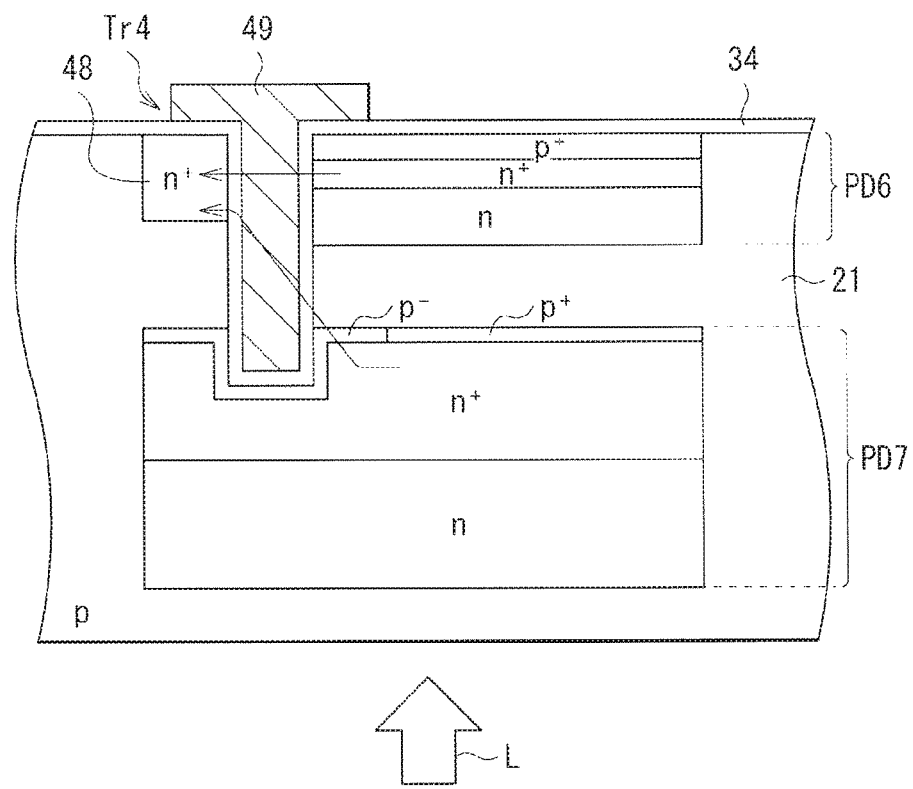
[ FIG. 7 ]
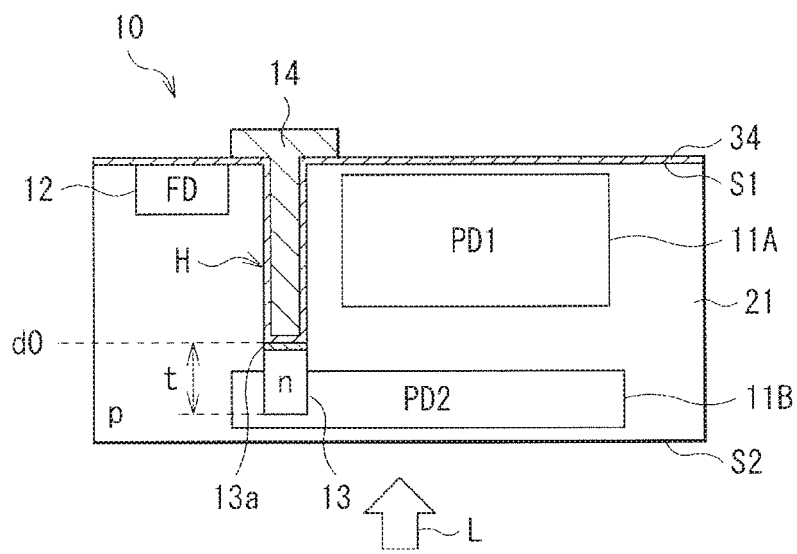

[FIG. 8A]
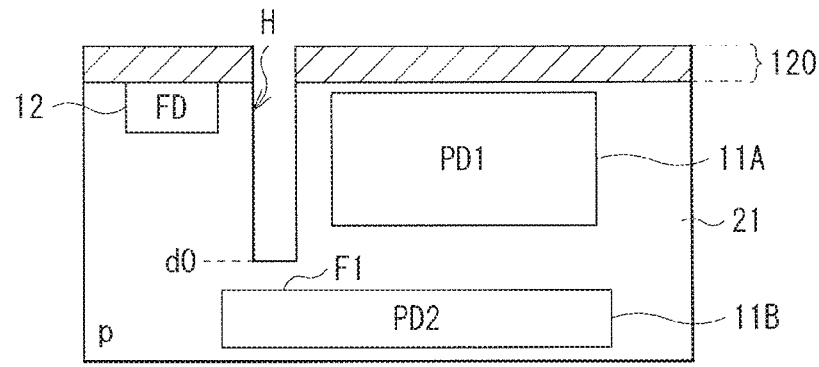
[FIG. 8B]
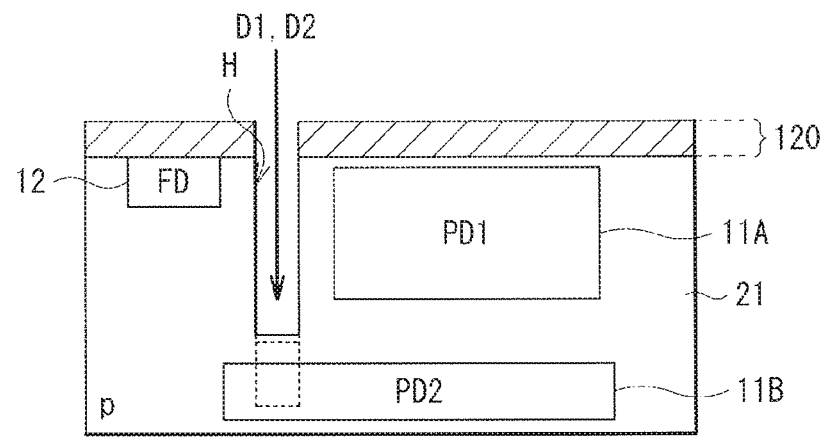
[FIG. 8C]
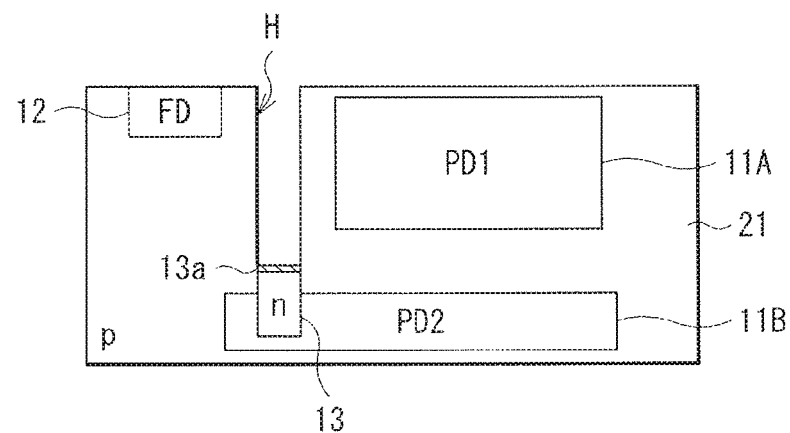

[ FIG. 9A ]
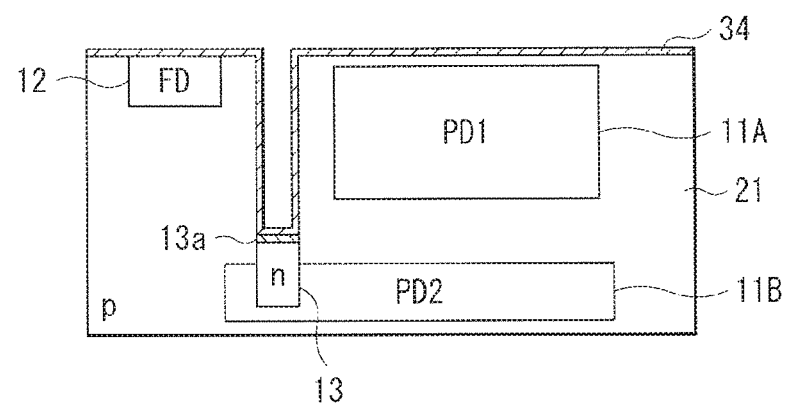
[ FIG. 9B ]
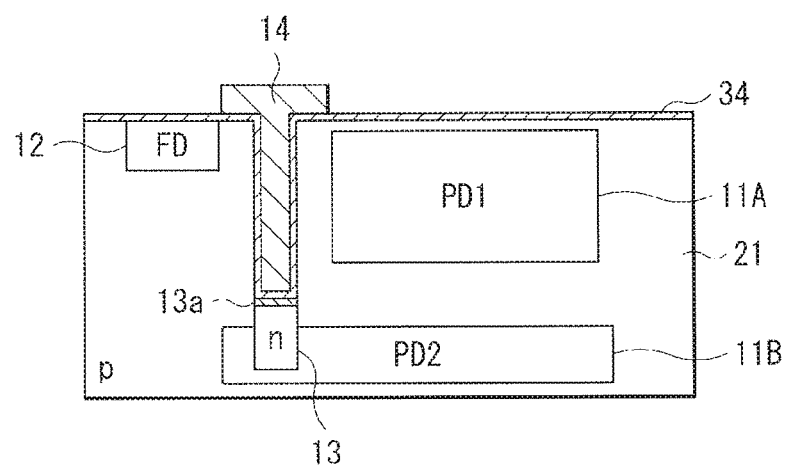

[ FIG. 10A ]
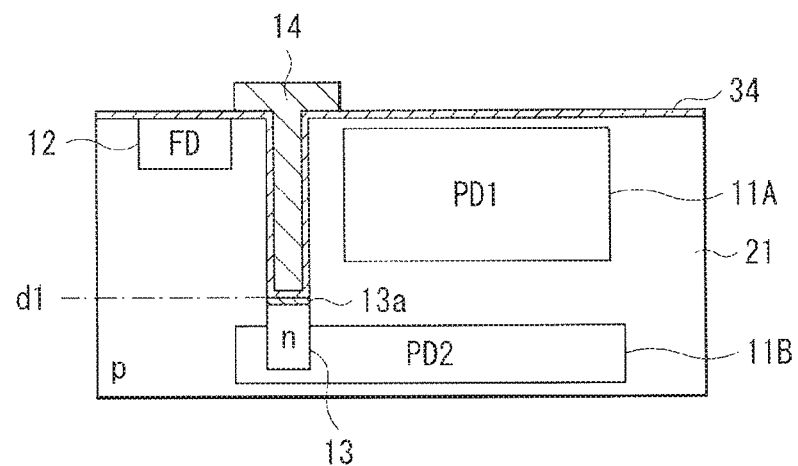
[ FIG. 10B ]
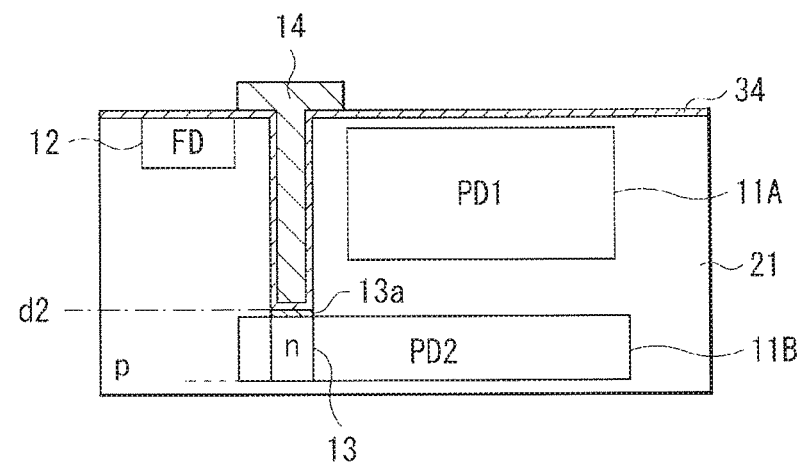

[ FIG. 11 ]
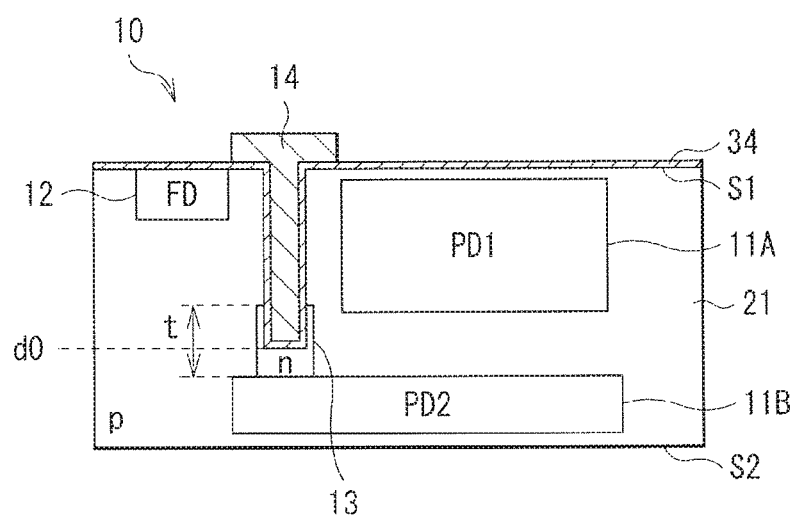

[ FIG. 12A ]
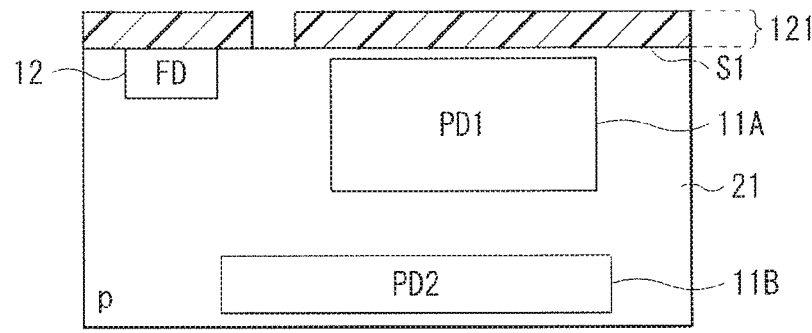
[ FIG. 12B ]
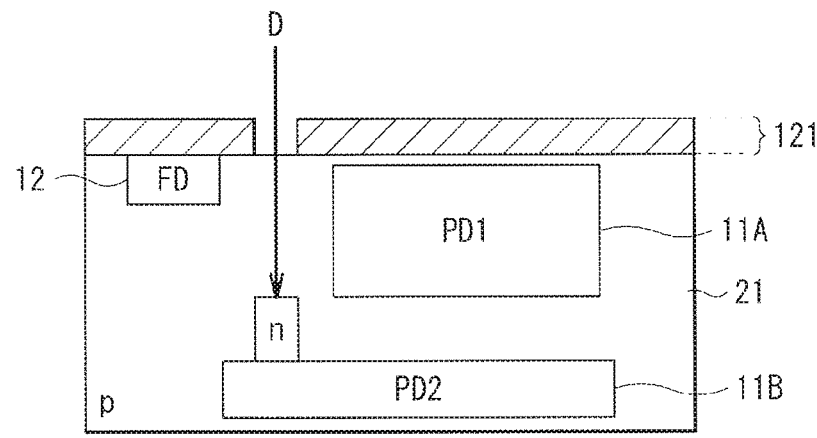
[ FIG. 12C ]
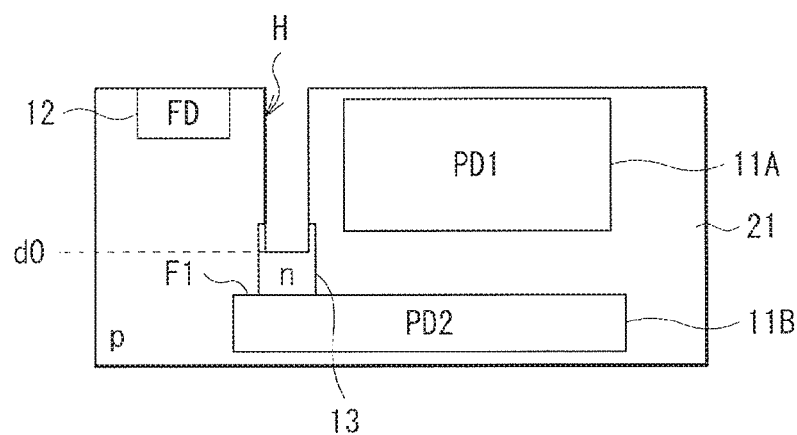

[ FIG. 12D ]
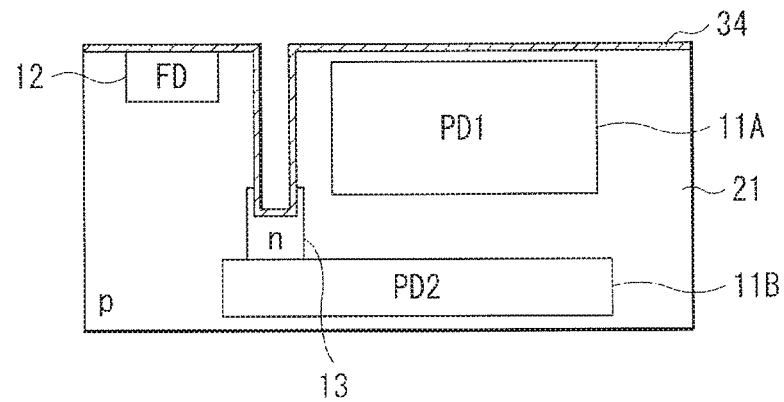
[ FIG. 12E ]
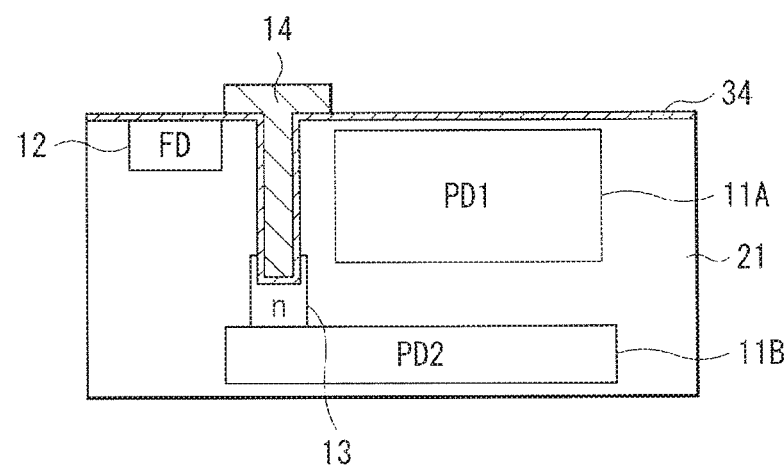
[ FIG. 13 ]
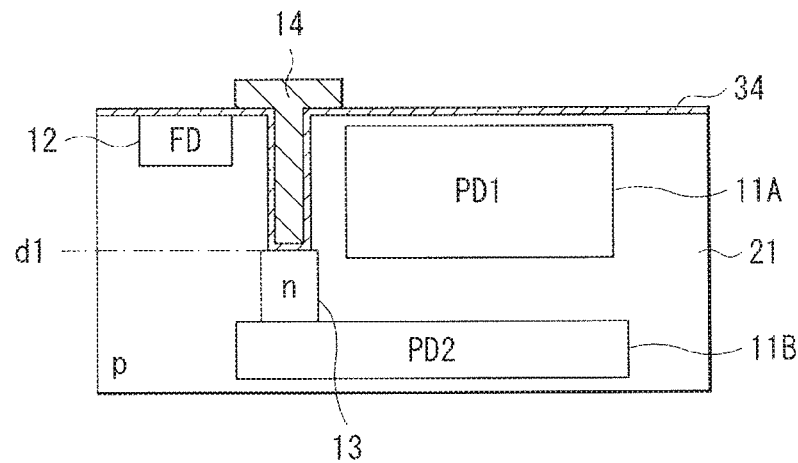

[ FIG. 14 ]
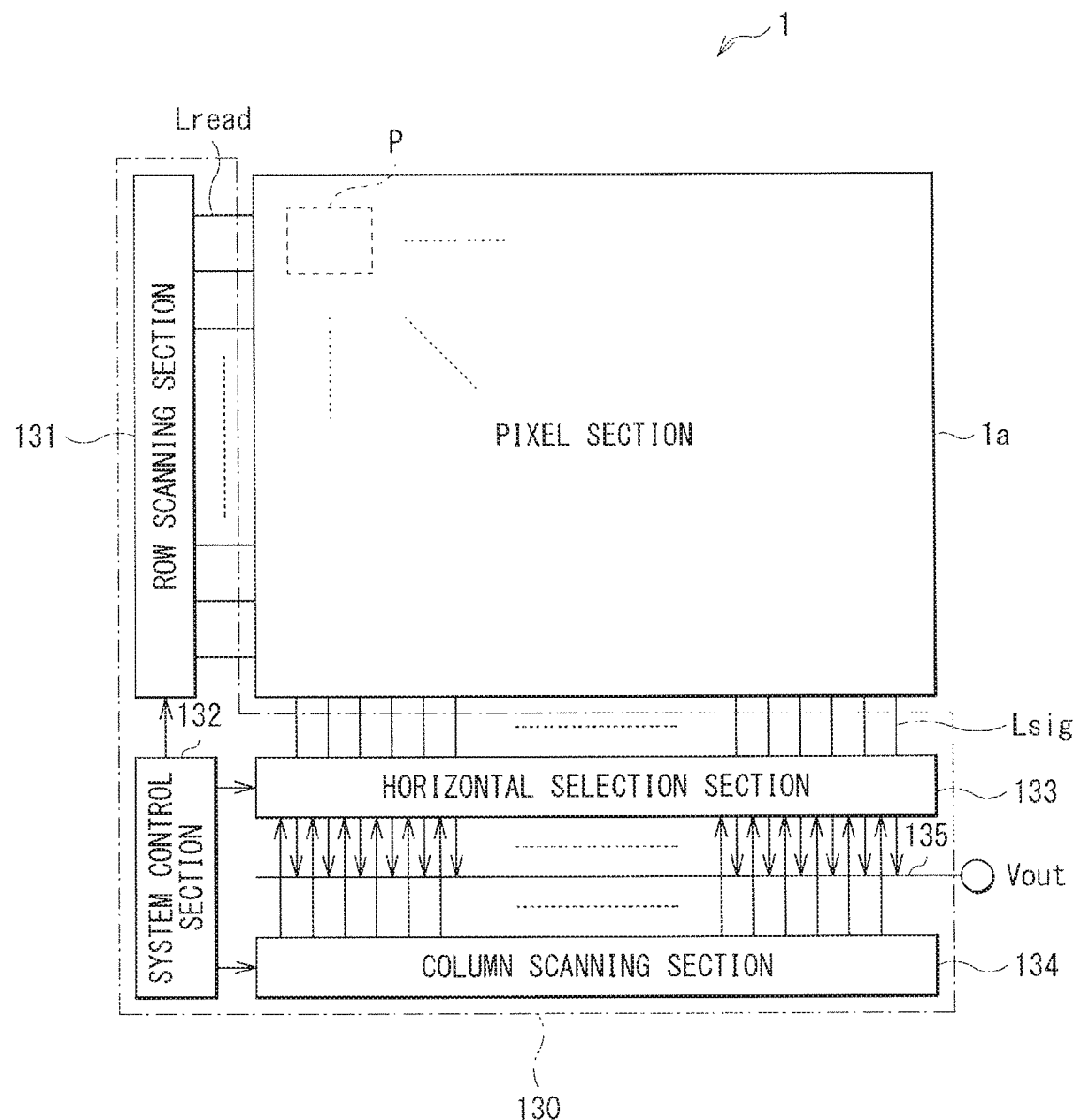

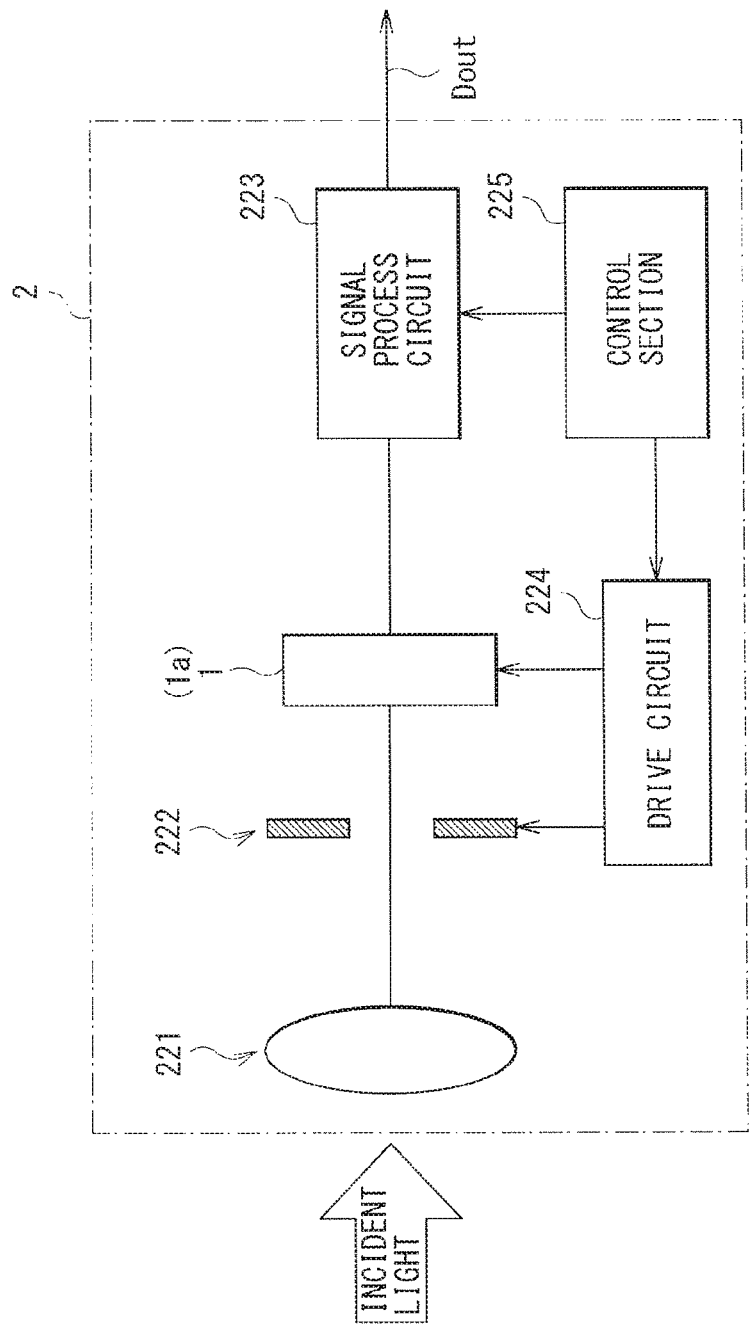
[FIG. 15]

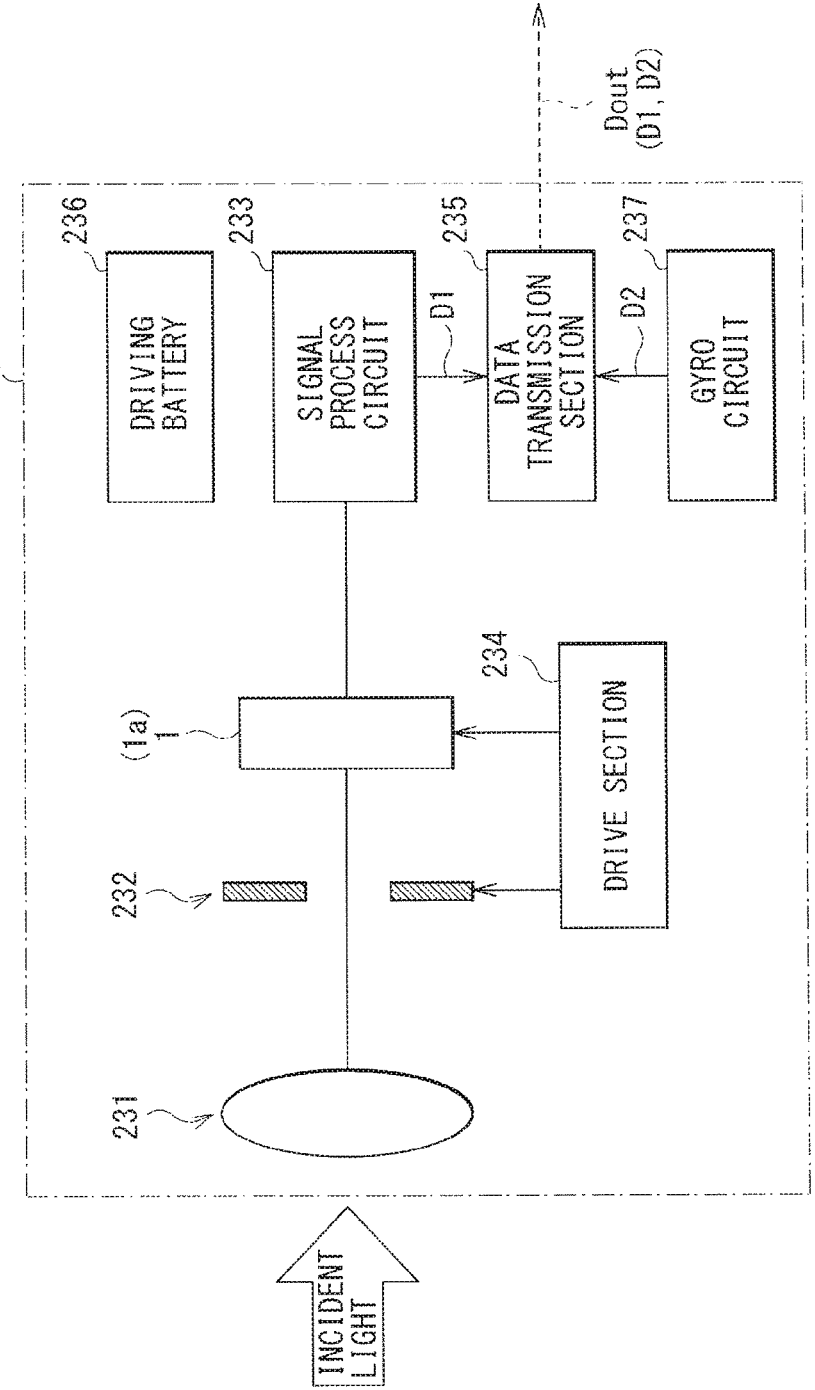
[FIG. 16]

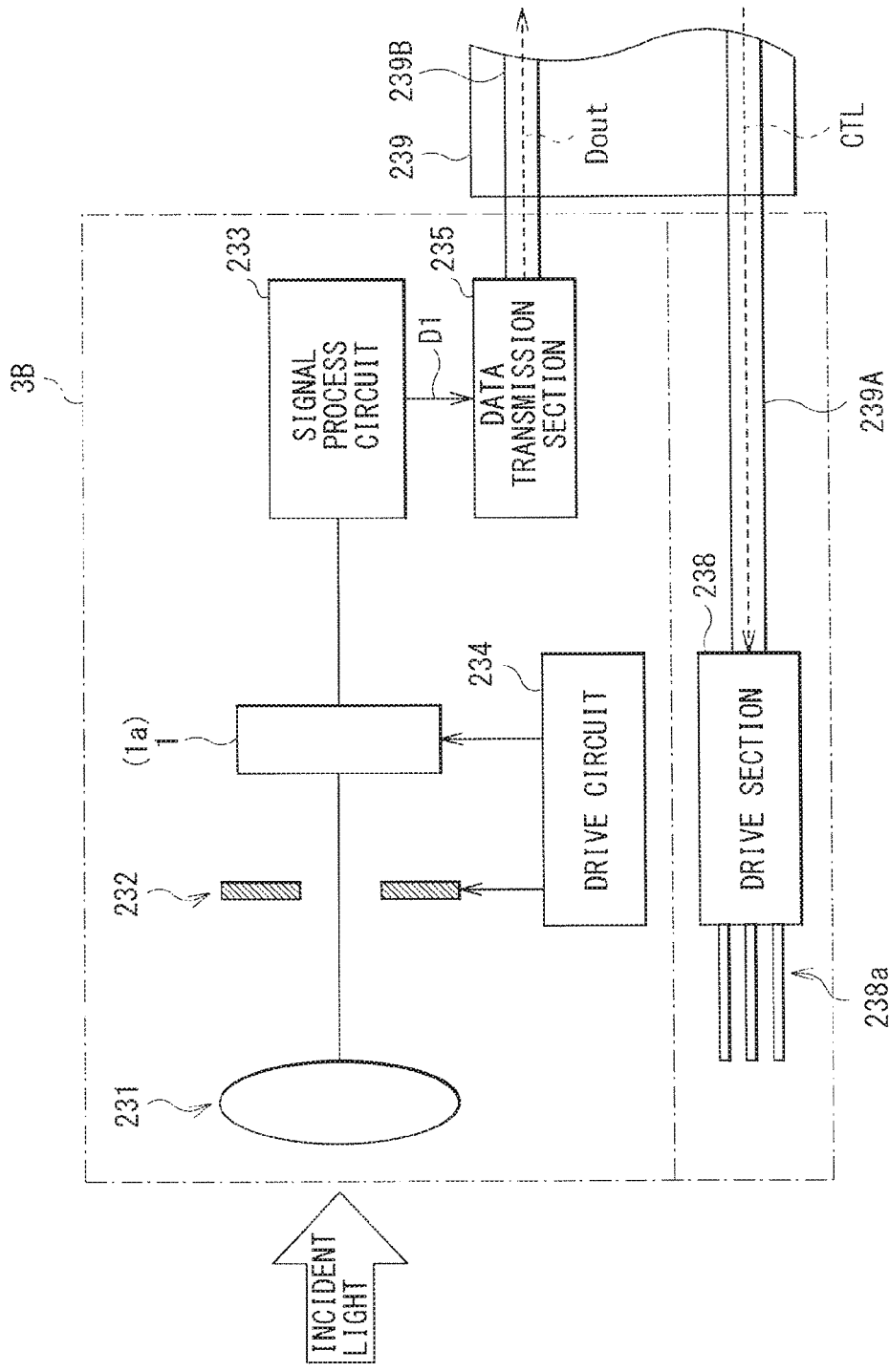

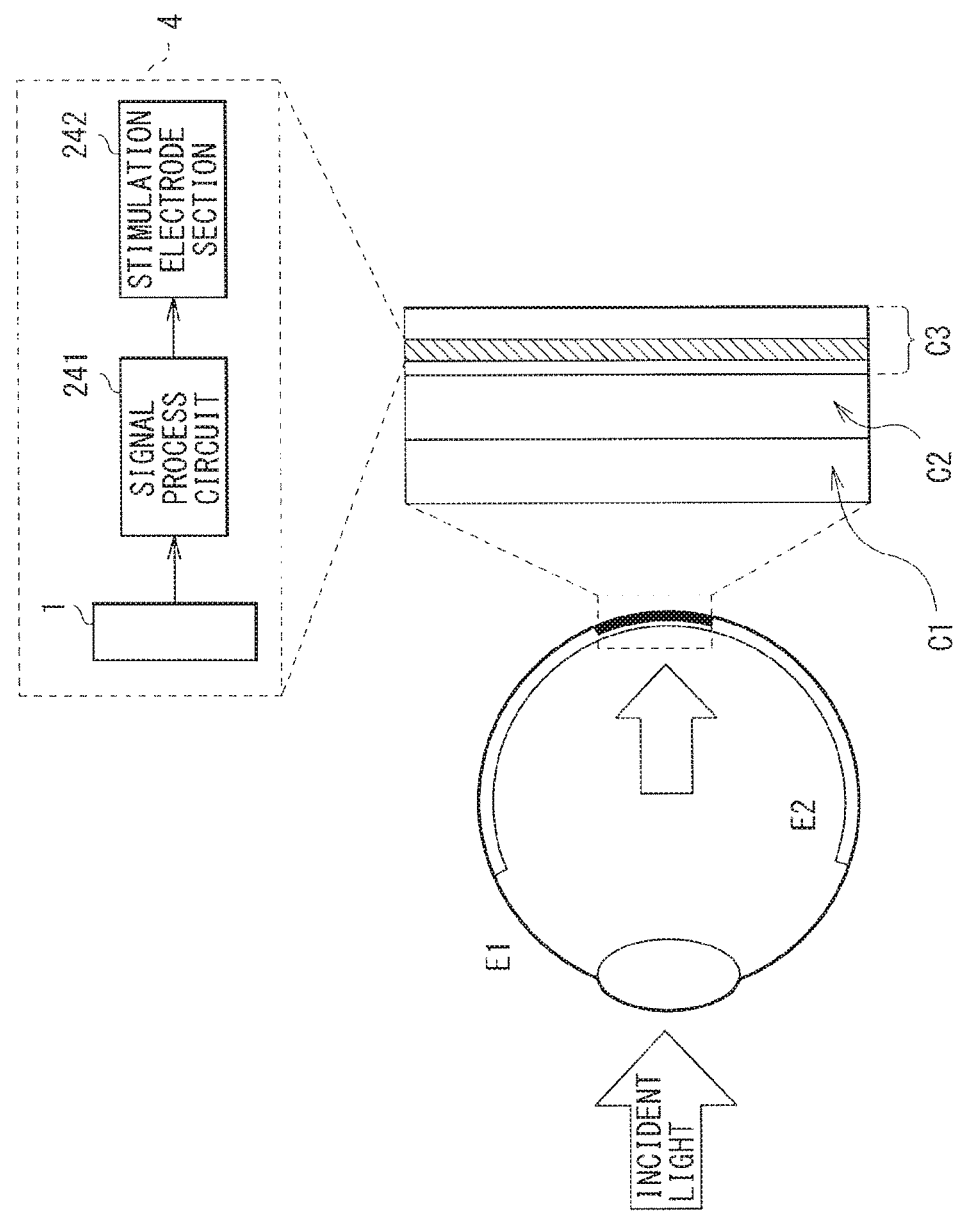
[FIG. 18]

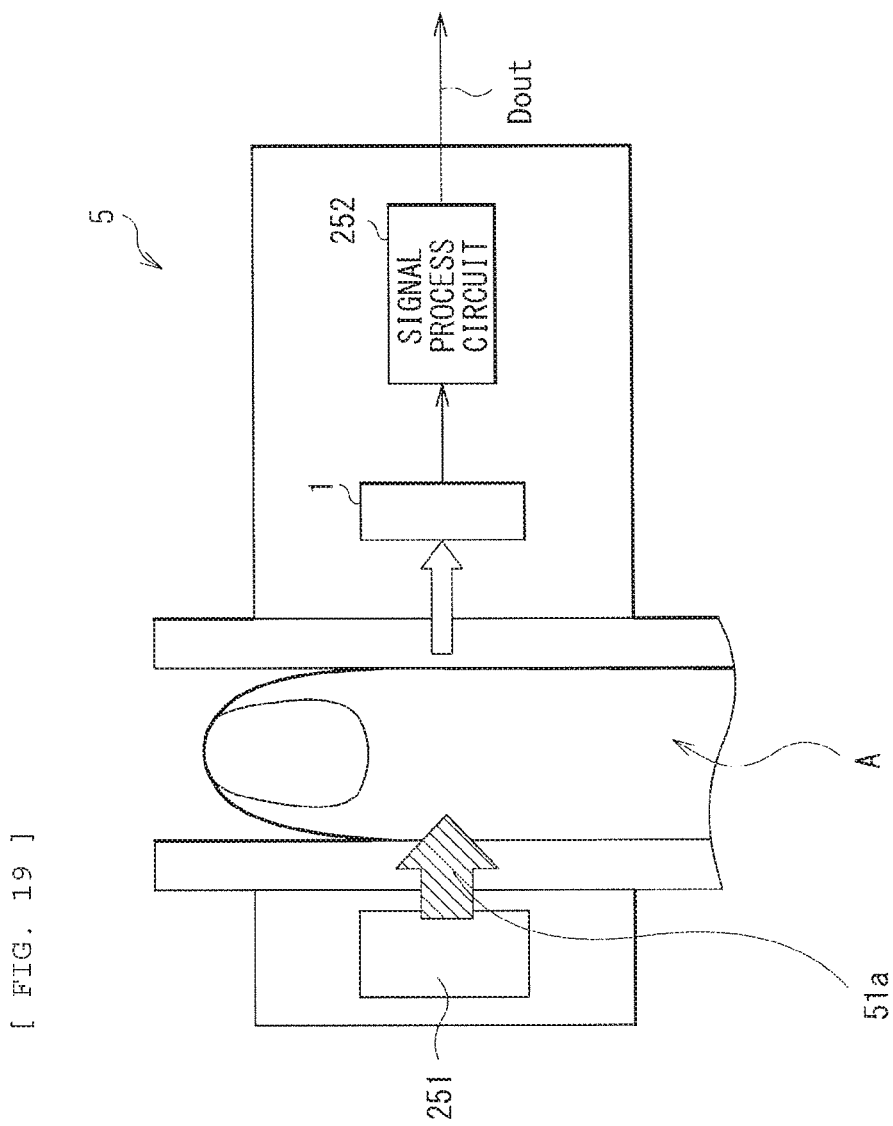
[FIG. 19]

SOLID-STATE IMAGE PICKUP DEVICE, METHOD OF MANUFACTURING SOLID-STATE IMAGE PICKUP DEVICE, AND ELECTRONIC APPARATUS

CROSS REFERENCE TO RELATED APPLICATIONS

This application is a continuation of U.S. patent application Ser. No. 15/087,733, filed Mar. 31, 2016, which is a continuation of U.S. patent application Ser. No. 14/889,552, filed Nov. 6, 2015, which is a national stage application under 35 U.S.C. 371 and claims the benefit of PCT Application No. PCT/JP2014/002458, filed May 9, 2014, which claims the benefit of Japanese Patent Application No. JP 2013-104000, filed May 16, 2013, the entire disclosures of which are hereby incorporated herein by reference.

The present disclosure relates to solid-state image pickup devices that include a photodiode, for example, in a semiconductor substrate, to methods of manufacturing the same, and to electronic apparatuses including the same.

BACKGROUND ART

A solid-state image pickup device, such as a COMS (Complementary Metal Oxide Semiconductor) image sensor, is manufacturable by a process similar to that of a CMOS integrated circuit. Such a solid-state image pickup device includes a pixel array section in which a plurality of pixels are arranged two-dimensionally. Also, such a solid-state image pickup device allows, using a miniaturization technology accompanying the above-described process, easy formation of an active structure that has an amplifying function for each pixel. Also, such a solid-state image pickup device has an advantage that a peripheral circuit section including circuits such as a drive circuit that drives the pixel array section, and a signal process circuit that processes an output signal from each pixel is integrated on the same chip (substrate) on which the pixel array section is formed. Therefore, the CMOS image sensor has been gaining increasing attention, and many studies and development on the CMOS image sensor have been made.

In recent years, for such a CMOS image sensor, there has been proposed a solid-state image pickup device in which three photodiodes that perform photoelectric conversion on light having respective wavelengths of R, G, and B are laminated in a vertical direction in one pixel (for example, PTL 1). Also, there has been proposed a structure in which two photodiodes are laminated in one pixel (for example, PTL 2). In these solid-state image pickup devices, a plurality of photodiodes are laminated in a semiconductor substrate, and therefore, for example, reading signal electric charges from part of the photodiodes is performed with the use of a so-called vertical transistor. Further, there has been proposed a technique in which the photodiodes are laminated next to (on side-face side of) the vertical transistor and electric charge transfer is performed from a side face of the vertical transistor to form a so-called over flow path at a bottom portion of the vertical transistor (for example, PTL 3).

CITATION LIST

Patent Literature

[PTL 1]
JP 2009-295937A
[PTL 2]
JP 2010-114273A
[PTL 3]
JP 2012-199489A

SUMMARY

Technical Problem

A vertical transistor used in a solid-state image pickup device as those described above has a gate electrode part of which may be embedded, for example, in a semiconductor substrate. It is desirable to suppress defect in transfer between the gate electrode of such a vertical transistor and a photodiode, and to improve yield.

It is desirable to provide a solid-state image pickup device, a method of manufacturing a solid-state image pickup device, and an electronic apparatus that are capable of suppressing defect in transfer in a vertical transistor and of improving yield.

Solution to Problem

Solid-state image pickup devices according to illustrative embodiments of the present disclosure include: a semiconductor substrate; a photodiode formed in the semiconductor substrate; a transistor having a gate electrode part or all of which is embedded in the semiconductor substrate, the transistor being configured to read a signal electric charge from the photodiode via the gate electrode; and an electric charge transfer layer provided between the gate electrode and the photodiode.

Methods of manufacturing a solid-state image pickup device according to illustrative embodiments of the present disclosure include: forming a transistor having a gate electrode part or all of which is embedded in a semiconductor substrate that includes a photodiode, the transistor being configured to read a signal electric charge from the photodiode via the gate electrode; and forming an electric charge transfer layer between the gate electrode and the photodiode.

Electronic apparatuses according to illustrative embodiments of the present disclosure include a solid-state image pickup device that includes: a semiconductor substrate; a photodiode formed in the semiconductor substrate; a transistor having a gate electrode part or all of which is embedded in the semiconductor substrate, the transistor being configured to read a signal electric charge from the photodiode via the gate electrode; and an electric charge transfer layer provided between the gate electrode and the photodiode.

The solid-state image pickup devices and the electronic apparatuses of the above-described embodiments of the present disclosure each include the photodiode formed in the semiconductor substrate, and the transistor configured to read the signal electric charge from the photodiode via the gate electrode part or all of which is embedded in the semiconductor substrate. Including the electric charge transfer layer between the photodiode and the gate electrode suppresses defect in transfer of signal electric charges caused by variations in positions of bottom faces of the gate electrodes in a depth direction.

In the methods of manufacturing the solid-state image pickup device of the above-described embodiments of the present disclosure, the photodiode is formed in the semiconductor substrate, and then, the transistor is formed that is configured to read the signal electric charge from the photodiode via the gate electrode part or all of which is embedded in the semiconductor substrate. Forming the electric charge transfer layer between the gate electrode and the photodiode suppresses defect in transfer of signal electric charges caused by variations in positions of bottom faces of the gate electrodes in a depth direction.

Advantageous Effects of Invention

According to the solid-state image pickup devices and the electronic apparatuses of the above-described embodiments of the present disclosure, there is included the photodiode formed in the semiconductor substrate, and the transistor configured to read the signal electric charge from the photodiode via the gate electrode part or all of which is embedded in the semiconductor substrate. By including the electric charge transfer layer between the photodiode and the gate electrode, defect in transfer of signal electric charges caused by variations in positions of the bottom faces of the gate electrodes in the depth direction is suppressed. Accordingly, it is possible to suppress defect in transfer performed by the vertical transistor, and to improve yield.

According to the methods of manufacturing the solid-state image pickup devices of the above-described embodiments of the present disclosure, the photodiode is formed in the semiconductor substrate, and then, the transistor is formed that is configured to read the signal electric charge from the photodiode via the gate electrode part or all of which is embedded in the semiconductor substrate. By forming the electric charge transfer layer between the gate electrode and the photodiode, defect in transfer of signal electric charges caused by variations in positions of the bottom faces of the gate electrodes in the depth direction is suppressed. Accordingly, it is possible to suppress defect in transfer performed by the vertical transistor, and to improve yield.

It is to be understood that both the foregoing general description and the following detailed description are exemplary, and are intended to provide further explanation of the technology as claimed.

BRIEF DESCRIPTION OF DRAWINGS

FIG. 1 is a cross-sectional schematic diagram showing an outline configuration of a solid-state image pickup device according to an illustrative first embodiment of the present disclosure.

FIG. 2A is a cross-sectional schematic diagram for explaining an illustrative method of manufacturing the solid-state image pickup device shown in FIG. 1.

FIG. 2B is a cross-sectional schematic diagram showing a process following an illustrative process shown in FIG. 2A.

FIG. 2C is a cross-sectional schematic diagram showing an illustrative process following the process shown in FIG. 2B.

FIG. 2D is a cross-sectional schematic diagram showing an illustrative process following the process shown in FIG. 2C.

FIG. 2E is a cross-sectional schematic diagram showing an illustrative process following the process shown in FIG. 2D.

FIG. 3A is a cross-sectional schematic diagram showing an illustrative connection configuration of a gate electrode and a photodiode in a case where an electric charge transfer layer is not formed.

FIG. 3B is a cross-sectional schematic diagram for explaining an illustrative defect in connection caused by variations in positions of bottom faces of the gate electrodes in a depth direction (in a case where the position of the gate electrode is shallow).

FIG. 3C is a cross-sectional schematic diagram for explaining an illustrative defect in connection caused by variations in positions of the bottom faces of the gate electrodes in the depth direction (in a case where the position of the gate electrode is deep).

FIG. 4A is a cross-sectional schematic diagram showing an illustrative connection configuration of a gate electrode in the solid-state image pickup device shown in FIG. 1 (in a case where the position of the gate electrode is shallow).

FIG. 4B is a cross-sectional schematic diagram showing an illustrative connection configuration of the gate electrode in the solid-state image pickup device shown in FIG. 1 (in a case where the position of the gate electrode is deep).

FIG. 5 is a cross-sectional schematic diagram showing an illustrative example of a vertical transistor.

FIG. 6 is a cross-sectional schematic diagram showing an illustrative example of the vertical transistor.

FIG. 7 is a cross-sectional schematic diagram showing an outline configuration of a solid-state image pickup device according to an illustrative second embodiment of the present disclosure.

FIG. 8A is a cross-sectional schematic diagram for explaining an illustrative method of manufacturing the solid-state image pickup device shown in FIG. 7.

FIG. 8B is a cross-sectional schematic diagram showing an illustrative process following a process shown in FIG. 8A.

FIG. 8C is a cross-sectional schematic diagram showing an illustrative process following the process shown in FIG. 8B.

FIG. 9A is a cross-sectional schematic diagram showing an illustrative process following the process shown in FIG. 8C.

FIG. 9B is a cross-sectional schematic diagram showing an illustrative process following the process shown in FIG. 9A.

FIG. 10A is a cross-sectional schematic diagram showing an illustrative connection configuration of a gate electrode in the solid-state image pickup device shown in FIG. 7 (in a case where the position of the gate electrode is shallow).

FIG. 10B is a cross-sectional schematic diagram showing an illustrative connection configuration of the gate electrode in the solid-state image pickup device shown in FIG. 7 (in a case where the position of the gate electrode is deep).

FIG. 11 is a cross-sectional schematic diagram showing an outline configuration of a solid-state image pickup device according to an illustrative third embodiment of the present disclosure.

FIG. 12A is a cross-sectional schematic diagram for explaining an illustrative method of manufacturing the solid-state image pickup device shown in FIG. 11.

FIG. 12B is a cross-sectional schematic diagram showing an illustrative process following a process shown in FIG. 12A.

FIG. 12C is a cross-sectional schematic diagram showing an illustrative process following the process shown in FIG. 12B.

FIG. 12D is a cross-sectional schematic diagram showing an illustrative process following the process shown in FIG. 12C.

FIG. 12E is a cross-sectional schematic diagram showing an illustrative process following the process shown in FIG. 12D.

FIG. 13 is a cross-sectional schematic diagram showing an illustrative connection configuration of a gate electrode in the solid-state image pickup device shown in FIG. 11 (in a case where the position of the gate electrode is shallow).

FIG. 14 is a functional block diagram showing an illustrative general configuration of the solid-state image pickup device shown in FIG. 1.

FIG. 15 is a functional block diagram showing an illustrative configuration of an image pickup apparatus according to Application example 1.

FIG. 16 is a functional block diagram showing an illustrative configuration of a capsule-type endoscopic camera according to Application example 2-1.

FIG. 17 is a functional block diagram showing an illustrative configuration of an insertion-type endoscopic camera according to Application example 2-2.

FIG. 18 is a functional block diagram showing an illustrative configuration of a vision chip according to Application example 3.

FIG. 19 is a functional block diagram showing an illustrative configuration of a biosensor according to Application example 4.

DESCRIPTION OF EMBODIMENTS

Some illustrative embodiments of the present disclosure will be described below in detail with reference to the drawings. It is to be noted that the description will be provided in the following order.
1. First Embodiment (an example of a solid-state image pickup device that includes an electric charge transfer layer adjacent to a bottom face of a concave section in a semiconductor substrate)
2. Second Embodiment (an example of a solid-state image pickup device that includes a dark current suppression layer between the bottom face of the concave section in the semiconductor substrate and an electric charge transfer layer)
3. Third Embodiment (an example of a solid-state image pickup device in which the electric transfer layer is formed before formation of the concave section in the semiconductor substrate)
4. General Configuration Example of Solid-state Image Pickup Device
5. Application Examples 1 to 4 (examples of electronic apparatuses)

First Embodiment

Configuration

FIG. 1 schematically illustrates a cross-sectional configuration of a solid-state image pickup device of a first embodiment of the present disclosure. FIG. 1 shows a region corresponding to one pixel in a pixel section (a pixel section 1a shown in FIG. 14) which will be described later. In this solid-state image pickup device, one or a plurality of photodiodes (two photodiodes 11A (PD1) and 11B (PD2), in this example) are laminated in a semiconductor substrate 21 that may be made of a material such as n-type silicon (Si). One face of the semiconductor substrate 21 serves as a circuit formation face S1. A multi-layered wiring layer that is not illustrated is formed on the circuit formation face S1. In the present embodiment, a face of the semiconductor substrate 21 that is opposite from the circuit formation face S1 serves as a light receiving face S2, and the present embodiment has a device structure of a so-called back illumination type. Components such as an on-chip lens that are not illustrated are provided on the light receiving face S2.

The photodiodes 11A and 11B may be formed, for example, in a p-type semiconductor region formed in the n-type semiconductor substrate 21. The photodiodes 11A and 11B may include, for example, photoelectric conversion layers that perform photoelectric conversion on light having wavelengths different from each other. For example, the photodiode 11A may include a photoelectric conversion layer that selectively absorbs light of red (R), and the photodiode 11B may include a photoelectric conversion layer that selectively absorbs light of blue (B). These photodiodes 11A and 11B each may include, for example, an n-type or p-type semiconductor layer as the photoelectric conversion layer that accumulates signal electric charges. In this example, the photodiodes 11A and 11B each include an n-type semiconductor layer that accumulates electrons as the signal electric charge, as an example case. However, the photodiodes 11A and 11B each may include a p-type semiconductor layer, and for example, may have a structure in which the p-type and n-type semiconductor layers are laminated to form a p-n junction, a p-n-p junction, etc. "First conductivity type" and "second conductivity type" in the present disclosure may indicate, for example, a combination of p-type and n-type, or a combination of n-type and p-type. However, in the present embodiment, description will be given referring to an example case in which "first conductivity type" is "n-type" and "second conductivity type" is "p-type".

These photodiodes 11A and 11B are each connected to a transistor for transferring signal electric charges. Out of the photodiodes 11A and 11B, for example, the photodiode (the photodiode 11B, in this example) that is formed in a deep position in the semiconductor substrate 21 (in a position away from the circuit formation face S1 of the semiconductor substrate 21) is connected to a vertical transistor 10.

The vertical transistor 10 is an electric charge transfer transistor, and includes a gate electrode 14, where at least a portion or all of the gate electrode 14 is embedded in the semiconductor substrate 21. Specifically, the semiconductor substrate 21 includes a concave section H, and the gate electrode 14 is formed in an embedded manner in this concave section H with a gate insulating film 34 in between. Other pixel transistors (such as an amplifier transistor, a reset transistor, and a selection transistor) that are not illustrated are formed on the circuit formation face S1. In the vertical transistor 10, for example, the photodiode 11B may serve as a source, for example, an FD 12 may serve as a drain, and a channel (an active layer) that is not illustrated may be formed in a region below the gate insulating film 34.

The gate electrode 14 may be configured, for example, of an electrically-conductive material such as polysilicon doped with n-type or p-type impurity at high concentration. The gate electrode 14 is connected to the wiring layer (not illustrated) formed on the circuit formation face S1. The gate insulating film 34 may be configured, for example, of an insulating film material such as a silicon oxide film.

The concave section H is formed by digging in a depth direction of the semiconductor substrate 21 (the vertical direction, a thickness direction) in part of the semiconductor substrate 21. The concave section H configures a groove having a shape such as a prismatic shape or a cylindrical shape. The concave section H is provided to allow a bottom face Sb thereof, for example, to face part of the photodiode 11B. The bottom face Sb of the concave section H may be in contact with the photodiode 11B, or may be located in the photodiode 11B. Alternatively, the bottom face Sb of the concave section H may be away from the photodiode 11B. In this example, there is illustrated a case, as an example, in which the bottom face Sb of the concave section H is away from the photodiode 11B with a predetermined distance. At the bottom face Sb of the concave section H, the gate electrode 14 is connected to the photodiode 11B via an electric charge transfer layer 13.

The electric charge transfer layer 13 is formed between the gate electrode 14 and the photodiode 11B, and configures part of a transfer path of signal electric charges from the photodiode 11B to the gate electrode 14 and the FD 12. The electric charge transfer layer 13 may be an impurity diffusion layer that may have, for example, conductivity that is the same as that of the photoelectric conversion layer in the photodiode 11B, for example, in the semiconductor substrate 21. In other words, the electric charge transfer layer 13 may be an n-type impurity diffusion layer. Therefore, the electric charge transfer layer 13 serves as the transfer path of the signal electric charges, and serves also as a photoelectric conversion layer. The electric charge transfer layer 13 has a thickness t that may be, for example, about from 50 nm to 2000 nm. Part or all of the electric charge transfer layer 13 is connected to the photoelectric conversion layer (the n-type semiconductor layer) in the photodiode 11B.

In the present illustrative embodiment, the electric charge transfer layer 13 is adjacent to the bottom face Sb of the concave section H. Although the details will be described later, the electric charge transfer layer 13 is formed by performing ion implantation with respect to the bottom face Sb using self-alignment, after forming the concave section H.

Manufacturing Method

The device structure of the solid-state image pickup device shown in FIG. 1 may be manufactured, for example, as follows. Specifically, as shown in FIG. 2A, for example, a mask 120 made of a material such as silicon nitride (SiN) may be formed, by a method such as a CVD method, on the semiconductor substrate 21 on which the photodiodes 11A and 11B, etc. are formed. By dry etching or wet etching with the use of the mask 120, the concave section H is formed in the semiconductor substrate 21. At this time, a position d0 (a reference position, a position to be the center of design) of the bottom face Sb of the concave section H is not particularly limited. The position d0 may be set to be matched with a position of a surface of the photodiode 11B or to be shifted from the position of the surface of the photodiode 11B. One reason for this may be that the electric charge transfer layer 13 improves freedom in the position, in the depth direction, of the bottom face Sb of the concave section H, as will be described later. For example, considering a case where the concave section H is formed deeply (which will be described later), the position d0 may be set in a shallower region (in a region closer to the circuit formation face S1) compared to a surface F1 of the photodiode 11B, as in the present illustrative embodiment. Before forming the concave section H, a concave-section formation region in the semiconductor substrate 21 may be doped with, for example, a p-type impurity with the use of a resist mask, and thereby a p-type region (which is not illustrated) is formed in advance. Therefore, the vertical transistor 10 has a configuration in which side faces of the concave section H (side faces of the gate electrode 14) are covered with the p-type region.

Subsequently, as shown in FIG. 2B, for example, an impurity D that has conductivity (of an n-type, in this example) same as that of the photodiode 11B may be injected, for example, by ion implantation with respect to the bottom face Sb of the concave section H. Thereafter, as shown in FIG. 2C, the mask 120 is removed from the semiconductor substrate 21. Thus, the electric charge transfer layer 13, for example, an n-type semiconductor region is formed, using self-alignment, to be adjacent to the bottom face Sb of the concave section H in the semiconductor substrate 21. The thickness t of the electric charge transfer layer 13 is adjustable by appropriately setting various conditions such as a dose amount in ion implantation and injection energy.

Subsequently, as shown in FIG. 2D, the gate insulating film 34 made of the above-described material may be formed to cover the bottom face Sb and the side faces of the concave section H, for example, by thermally oxidizing a silicon oxide film. However, this is not limitative, and other methods such as a CVD method and a sputtering method may be used.

Subsequently, as shown in FIG. 2E, the gate electrode 14 made of the above-described material or the like is formed. Specifically, a polysilicon film may be formed, by a method such as an LP-CVD (Low Pressure-Chemical Vapor Deposition) method, on the semiconductor substrate 21 to fill the concave section H with the polysilicon film. During the formation of the polysilicon film, the polysilicon film may be doped, for example, with a p-type or n-type impurity at high concentration. Thereafter, the polysilicon film doped with the impurity may be patterned in a predetermined shape, for example, by etching using a photolithography method, and thereby, the gate electrode 14 is formed. In such a manner, the vertical transistor 10 is formed.

After the wiring layer is formed on the circuit formation face S1 of the semiconductor substrate 21, the semiconductor substrate 21 is ground to have a favorable and/or improved thickness, and thereby, the light receiving face S2 is formed. Components such as an on-chip lens may be formed on the light receiving face S2 as necessary. Thus, the solid-state image pickup device shown in FIG. 1 is completed.

Functions and Effects

In the solid-state image pickup device of the present embodiment, when light L enters the light receiving face S2, light that has a selective wavelength (for example, blue light) out of the light L is absorbed by the photodiode 11B, and is subjected to photoelectric conversion. Light that has a selective wavelength (for example, red light) out of the light passed through the photodiode 11B is absorbed by the photodiode 11A, and is subjected to photoelectric conversion. Signal electric charges (for example, electrons) generated by the photoelectric conversion are transferred, at predetermined timings, for example, to the FDs (floating diffusions) for each of the photodiode 11A and 11B. The transferred signal electric charges are read out to signal lines (vertical signal lines Lsig) which will be described later. Out of these signal electric charges, the signal electric charges generated in the photodiode 11B are transferred to the FD 12 via the gate electrode 14 of the vertical transistor 10.

In such an illustrative manner, in the device structure in which the plurality of photodiodes 11A and 11B are laminated in the semiconductor substrate 21, reading of the signal electric charges from the photodiode 11B that is arranged in a deeper position (in a position farther from the circuit formation face S2) is performed with the use of the vertical transistor 10. For example, as shown in FIG. 3A, the signal electric charges are transferred from the photodiode 11B to the FD 12 via the gate electrode 14 by connecting the gate electrode 14 to the photodiode 11B at the bottom portion (the bottom face Sb of the concave section H) of the vertical transistor 10.

However, in such a vertical transistor 10, variations in positions of the bottom face of the gate electrode 14 in the depth direction (variations in positions of the bottom face of the concave section H) occur, and these variations easily result in defects in transfer. Specifically, as shown in FIG. 3A, in the manufacturing process, even when a position $d_{100}$ (a reference position, a position of the center of design) of the bottom face Sb of the concave section H is set to be just in contact with the photodiode 11B, the concave section H may be formed, in some cases, in a shallower position (FIG. 3B) or in a deeper position (FIG. 3C). As shown in FIG. 3B, when the concave section H is formed in a position shallower than the position $d_{100}$ (when the bottom face Sb is in a position dio1), the photodiode 11B is further from the vertical transistor 10. Accordingly, a so-called potential barrier is caused in the transfer path, and a defect is caused in transferring the electric charges. On the other hand, as shown in FIG. 3C, when the concave section H is formed at a position deeper than the position $d_{100}$ (when the bottom face Sb is in a position $d_{102}$), a contact portion of the photodiode 11B and the vertical transistor 10 is excessively large. Accordingly, a so-called potential dip is caused, and a defect in transfer is caused.

In the present illustrative embodiment, the electric charge transfer layer 13 is provided between such a vertical transistor 10 (the gate electrode 14) and the photodiode 11B. And in various embodiments, the electric charge transfer layer 13 may be provided in contact with such a vertical transistor 10 (the gate electrode 14) and the photodiode 11B. Therefore, it is possible to suppress defects in transfer that are caused by variations in positions of the bottom face of the gate electrode 14 in the depth direction, as described herein. Specifically, as shown in FIG. 4A, even when the concave section H is formed in a position shallower than the position d0 (when the bottom face Sb is in a position d1), the photodiode 11B is connected to the vertical transistor 10 via the electric charge transfer layer 13. Therefore, a defect in transferring the signal electric charges is suppressed. On the other hand, as shown in FIG. 4B, even when the concave section H is formed in a position deeper than the position d0 (when the bottom face Sb is in a position d2), a defect in transferring the signal electric charges caused by potential dip as described above is suppressed. For example, it is possible to suppress defects in transfer when the concave section H is formed in a deeper position, for example, by setting the position d0 that is to be a reference for the bottom face Sb of the concave section H in a shallower position in advance.

As described above, the present illustrative embodiment includes the photodiodes 11A and 11B that are formed in the semiconductor substrate 21, and the vertical transistor 10 that has the gate electrode 14, part or all of which is embedded in the semiconductor substrate 21. By including the electric charge transfer layer 13 between the photodiode 11B and the gate electrode 14, it is possible to suppress defects in transferring the signal electric charges caused by variations in positions of the bottom face of the gate electrode 14 in the depth direction. Therefore, it is possible to suppress defect in transfer performed by the vertical transistor, and to improve yield.

Moreover, in the present illustrative embodiment, the electric charge transfer layer 13 is formed only at the bottom portion of the vertical transistor 10. Therefore, the present illustrative embodiment also has an effect, for example, that spectroscopic characteristics of the laminated photodiodes 11A and 11B are improved. One reason for this may be that it is easier to secure a larger formation region of the photodiode 11A that performs photoelectric conversion on red light.

The above-described electric charge transfer layer 13 is applicable to various types of device structures that use a vertical transistor in order to read signal electric charges from a photodiode in a semiconductor substrate. For example, as shown in FIG. 5, the above-described electric charge transfer layer 13 may be applicable also to a structure in which three photodiodes (PD3, PD4, and PD5) that are capable of performing photoelectric conversion on red light (Lr), green light (Lg), and blue light (Lb), respectively, are laminated in the semiconductor substrate 21, and vertical transistors (Tr1, Tr2, and Tr3) are connected to the respective photodiodes. Alternatively, as shown in FIG. 6, the above-described electric charge transfer layer 13 may be applicable to a structure in which one (common) vertical transistor (Tr4) is provided for two laminated photodiodes (PD6 and PD7). As described above, the above-described electric charge transfer layer 13 is applicable to various types of device structures that use vertical transistors.

The following description will be given regarding other illustrative embodiments and modifications of the solid-state image pickup device according to the above-described first embodiment. Hereinafter, components similar to those in the above-described first embodiment will be designated with the same numerals and description thereof will be omitted as appropriate.

Second Embodiment

Configuration

FIG. 7 schematically illustrates a cross-sectional configuration of a solid-state image pickup device of a second embodiment of the present disclosure. FIG. 7 shows a region corresponding to one pixel in the pixel section (the pixel section 1a shown in FIG. 14) which will be described later. This solid-state image pickup device includes one or a plurality of photodiodes (two photodiodes 11A and 11B, in this example) in the semiconductor substrate 21, as in the above-described first embodiment. Also, a multi-layered wiring layer that is not illustrated is formed on the circuit formation face S1 of the semiconductor substrate 21. The present embodiment has a device structure of a so-called back illumination type in which a face, of the semiconductor substrate 21, opposite from the circuit formation face S1 serves as the light receiving face S2. Components such as an on-chip lens that are not illustrated are provided on the light receiving face S2.

Also in the present embodiment, as in the above-described first embodiment, the photodiodes 11A and 11B are each connected to a transistor for transferring signal electric charges. Out of the photodiodes 11A and 11B, the photodiode 11B is connected to the vertical transistor 10. The vertical transistor 10 includes the gate electrode 14. The gate electrode 14 is provided to allow the concave section H in the semiconductor substrate 21 to be filled with part or all of the gate electrode 14 with the gate insulating film 34 in between. The concave section H may be provided to allow the bottom face Sb thereof, for example, to face part of the photodiode 11B. The gate electrode 14 is connected to the photodiode 11B via the electric charge transfer layer 13 at the bottom face Sb.

However, in the present embodiment, a dark current suppression layer 13a is further formed between the bottom face Sb of the concave section H and the electric charge transfer layer 13. The dark current suppression layer 13a is an impurity diffusion layer that exhibits conductivity (for example, of a p-type) different from that of the electric charge transfer layer 13. The dark current suppression layer 13a may have a thickness, for example, about from 5 nm to 100 nm, that is sufficiently smaller than the thickness t of the electric charge transfer layer 13. In such a manner, the dark current suppression layer 13a and the electric charge transfer layer 13 are laminated in order from the bottom face Sb of the concave section H in the present embodiment. Such electric charge transfer layer 13 and dark current suppression layer 13a are formed by performing ion implantation in a multiple-step manner with respect to the bottom face Sb using so-called self-alignment, after forming the concave section H.

Manufacturing Method

The device structure of the solid-state image pickup device shown in FIG. 7 may be manufactured, for example, as follows. Specifically, as shown in FIG. 8A, for example, the concave section H may be formed in the semiconductor substrate 21, for example, with the use of the mask 120 of silicon nitride that may be formed by the CVD method in a manner similar to that in the above-described first embodiment. On the semiconductor substrate 21, the photodiodes 11A and 11B have been formed. At this time, the position d0 of the bottom face Sb of the concave section H is not particularly limited as described above. For example, taking into consideration of a case where the concave section H is formed deeply (which will be described later), the position d0 may be set in a shallower region (in a region closer to the circuit formation face S1) compared to the surface F1 of the photodiode 11B.

Subsequently, the electric charge transfer layer 13 and the dark current suppression layer 13a are formed, for example, by ion implantation in a multiple-step manner with respect to the bottom face Sb of the concave section H. Specifically, as shown in FIG. 8B, for example, an impurity D1 that exhibits conductivity (for example, of an n-type) the same as that of the photodiode 11B may be injected. Thereafter, an impurity D2 that exhibits conductivity (for example, of a p-type) opposite therefrom is injected. Thereafter, as shown in FIG. 8C, the mask 120 is removed from the semiconductor substrate 21. Thus, the electric charge transfer layer 13 and the dark current suppression layer 13a are formed using self-alignment. Also in the present illustrative embodiment, the thicknesses of the electric charge transfer layer 13 and the dark current suppression layer 13a are adjustable by appropriately setting various conditions such as a dose amount and injection energy.

Subsequently, as shown in FIG. 9A, the gate insulating film 34 made of the above-described material may be formed in a manner similar to that in the above-described first embodiment. Subsequently, as shown in FIG. 9B, the gate electrode 14 made of the above-described material is formed in a manner similar to that in the above-described first embodiment. Thus, the vertical transistor 10 is formed. At last, after the wiring layer is formed on the circuit formation face S1 of the semiconductor substrate 21, the semiconductor substrate 21 is ground, and components such as on-chip lens may be formed on the light receiving face S2 as necessary. Thus, the solid-state image pickup device shown in FIG. 7 is completed.

Functions and Effects

In the solid-state image pickup device of the present illustrative embodiment, as in the above-described first embodiment, when the light L enters the light receiving face S2, light with predetermined wavelengths is subjected to photoelectric conversion by the respective photodiodes 11A and 11B. Signal electric charges (for example, electrons) generated by the photoelectric conversion are transferred, at predetermined timings, to the FDs. Thereafter, the transferred signal electric charges are read out to the signal lines (the vertical signal lines Lsig) which will be described later. Out of these signal electric charges, the signal electric charges generated in the photodiode 11B are transferred to the FD 12 via the gate electrode 14 of the vertical transistor 10.

Also in the present illustrative embodiment, the electric charge transfer layer 13 is provided between the vertical transistor 10 (the gate electrode 14) and the photodiode 11B. Therefore, it is possible to suppress defect in transfer that is caused by variations in positions of the bottom face of the gate electrode 14 in the depth direction, as in the above-described first embodiment. Specifically, as shown in FIG. 10A, even when the concave section H is formed in a position shallower than the position d0 (when the bottom face Sb is in a position d1), the photodiode 11B is connected to the vertical transistor 10 via the electric charge transfer layer 13. Therefore, defect in transferring the signal electric charges is suppressed. On the other hand, as shown in FIG. 10B, even when the concave section H is formed in a position deeper than the position d0 (when the bottom face Sb is in a position d2), defect in transferring the signal electric charges caused by potential dip as described above is suppressed. For example, it is possible to suppress defect in transfer when the concave section H is formed in a deeper position, for example, by setting the position d0 that is to be a reference for the bottom face Sb of the concave section H in a shallower position in advance.

Moreover, in the present illustrative embodiment, the dark current suppression layer 13a is formed between the bottom face Sb of the concave section H and the electric charge transfer layer 13. Therefore, even in a case, for example, where digging damage of the concave section H is caused (a damage is caused, for example, in the bottom face Sb during etching), it is possible to suppress occurrence of dark current caused by the digging damage.

As described above, the present illustrative embodiment includes the photodiodes 11A and 11B that are formed in the semiconductor substrate 21, and the vertical transistor 10 that has the gate electrode 14 part or all of which is embedded in the semiconductor substrate 21. By including the electric charge transfer layer 13 between the photodiode 11B and the gate electrode 14, it is possible to suppress defect in transferring the signal electric charges caused by variations in positions of the bottom face of the gate electrode 14 in the depth direction. Therefore, it is possible to obtain an effect equivalent to that in the above-described first embodiment. Moreover, it is possible to suppress, by the dark current suppression layer 13a, occurrence of dark current caused by the digging damage of the concave section H.

Third Embodiment

Configuration

FIG. 11 schematically illustrates a cross-sectional configuration of a solid-state image pickup device of a third embodiment of the present disclosure. FIG. 11 shows a region corresponding to one pixel in the pixel section (the pixel section 1a shown in FIG. 14) which will be described later. This solid-state image pickup device includes one or a plurality of photodiodes (two photodiodes 11A and 11B, in this example) in the semiconductor substrate 21, as in the above-described first embodiment. Also, a multi-layered wiring layer that is not illustrated is formed on the circuit formation face S1 of the semiconductor substrate 21. The present illustrative embodiment has a device structure of a so-called back illumination type in which a face, of the semiconductor substrate 21, opposite from the circuit formation face S1 serves as the light receiving face S2. Components such as an on-chip lens that are not illustrated are provided on the light receiving face S2.

Also in the present illustrative embodiment, the photodiodes 11A and 11B are each connected to a transistor for transferring signal electric charges, as in the above-described first embodiment. Out of the photodiodes 11A and 11B, the photodiode 11B is connected to the vertical transistor 10. The vertical transistor 10 includes the gate electrode 14. The gate electrode 14 is provided to allow the concave section H in the semiconductor substrate 21 to be filled with part or all of the gate electrode 14 with the gate insulating film 34 in between. The concave section H may be provided to allow the bottom face Sb thereof, for example, to face part of the photodiode 11B. The gate electrode 14 is connected to the photodiode 11B via the electric charge transfer layer 13 at the bottom face Sb.

However, in the present illustrative embodiment, a timing for forming the concave section H and a timing for forming the electric charge transfer layer 13 are different from those in the above-described first embodiment. Specifically, in the present embodiment, the concave section H is formed after forming the electric charge transfer layer 13. Therefore, in terms of device structure, the electric charge transfer layer 13 covers not only the bottom face Sb of the concave section H but also part of the side faces of the concave section H. However, the electric charge transfer layer 13 does not necessarily cover part of the side faces of the concave section H. In other words, the electric charge transfer layer 13 may be in contact only with the bottom face Sb. In this case, the device structure in the present embodiment is almost the same as the device structure in the above-described first embodiment (FIG. 1).

Manufacturing Method

The device structure of the solid-state image pickup device shown in FIG. 11 may be manufactured, for example, as follows. Specifically, as shown in FIG. 12A, for example, a photoresist 121 may be formed on the semiconductor substrate 21 on which the photodiodes 11A and 11B, etc. are formed, and the formed photoresist 121 is patterned. Subsequently, as shown in FIG. 12B, the electric charge transfer layer 13 is formed in the semiconductor substrate 21 with the use of the photoresist 121 as a mask. Specifically, the impurity D is injected in a predetermined depth position of the semiconductor substrate 21 (in a position determined in consideration of variations in positions of the bottom face of the concave section H in the depth direction) by performing ion implantation. Thereafter, the photoresist 121 is peeled off from the semiconductor substrate 21. Subsequently, as shown in FIG. 12C, the concave section H is formed in the semiconductor substrate 21 in a manner similar to that in the above-described first embodiment. At this time, the position d0 of the bottom face Sb of the concave section H is not particularly limited as described above. However, in the present illustrative embodiment, the position d0 may be set in a region shallower than the surface F1 of the photodiode 11B (in a region closer to the circuit formation face S1).

Subsequently, as shown in FIG. 12D, the gate insulating film 34 made of the above-described material may be formed in a manner similar to that in the above-described first embodiment. Subsequently, as shown in FIG. 12E, the gate electrode 14 made of the above-described material is formed in a manner similar to that in the above-described first embodiment. Thus, the vertical transistor 10 is formed. At last, after the wiring layer is formed on the circuit formation face S1 of the semiconductor substrate 21, the semiconductor substrate 21 is ground, and components such as on-chip lens may be formed on the light receiving face S2 as necessary. Thus, the solid-state image pickup device shown in FIG. 11 is completed.

In such a manner, the electric charge transfer layer 13 may be formed in advance, by ion implantation, in a region in which variations in depth of the concave section H is assumed to be caused.

Functions and Effects

In the solid-state image pickup device of the present illustrative embodiment, as in the above-described first embodiment, when the light L enters the light receiving face S2, light with predetermined wavelengths is subjected to photoelectric conversion by the respective photodiodes 11A and 11B. Signal electric charges (for example, electrons) generated by the photoelectric conversion are transferred, at predetermined timings, to the FDs. Thereafter, the transferred signal electric charges are read out to the signal lines (the vertical signal lines Lsig) which will be described later. Out of these signal electric charges, the signal electric charges generated in the photodiode 11B are transferred to the FD 12 via the gate electrode 14 of the vertical transistor 10.

Also in the present embodiment, the electric charge transfer layer 13 is provided between the vertical transistor 10 (the gate electrode 14) and the photodiode 11B. Therefore, it is possible to suppress defect in transfer that is caused by variations in positions of the bottom face of the gate electrode 14 in the depth direction. Specifically, as shown in FIG. 13, even when the concave section H is formed in a position shallower than the position d0 (when the bottom face Sb is in a position d1), the photodiode 11B is connected to the vertical transistor 10 via the electric charge transfer layer 13. Therefore, defect in transferring the signal electric charges is suppressed. On the other hand, when the concave section H is formed in a position deeper than the position d0 (when the bottom face Sb is in a position d2), influence of potential dip is reduced by adjusting, for example, impurity concentration (dose amount) in the electric charge transfer layer 13.

As described above, the present illustrative embodiment includes the photodiodes 11A and 11B that are formed in the semiconductor substrate 21, and the vertical transistor 10 that has the gate electrode 14 part or all of which is embedded in the semiconductor substrate 21. By including the electric charge transfer layer 13 between the photodiode 11B and the gate electrode 14, it is possible to suppress defect in transferring the signal electric charges caused by variations in positions of the bottom face of the gate electrode 14 in the depth direction. Therefore, it is possible to obtain an effect equivalent to that in the above-described first embodiment.

Device Configuration

FIG. 14 illustrates a general configuration of any of the solid-state image pickup devices described above in the respective embodiments (hereinafter, referred to as "solid-state image pickup device 1"). The solid-state image pickup device 1 includes the pixel section 1a as an image pickup area. Also, the solid-state image pickup device 1 includes a peripheral circuit section 130 that may include, for example, a row scanning section 131, a horizontal selection section 133, a horizontal selection section 134, and a system control section 132.

The pixel section 1a may include a plurality of unit pixels (pixels P) that are arranged two-dimensionally in a matrix. With respect to the pixels P, for example, pixel drive lines Lread (specifically, row selection lines and reset control lines) may be wired for respective pixel rows, and vertical signal lines Lsig may be wired for respective pixel columns. The pixel drive line Lread transmits a drive signal for reading a signal from the pixel. One end of the pixel drive line Lread is connected to an output end corresponding to each row of the row scanning section 131.

The row scanning section 131 is configured of components such as a shift register and an address decoder. The row scanning section 131 is a pixel drive section that may drive the respective pixels P in the pixel section 1a, for example, on pixel row basis. A signal outputted from each pixel P in the pixel row selectively scanned by the row scanning section 131 is supplied to the horizontal selection section 133 via each of the vertical signal lines Lsig. The horizontal selection section 133 is configured of components such as an amplifier and a horizontal selection switch that are provided for each vertical signal line Lsig.

The horizontal selection section 134 is configured of components such as a shift register and an address decoder. The horizontal selection section 134 sequentially drives the respective horizontal selection switches in the horizontal selection section 133 while scanning the respective horizontal selection switches. By the selective scanning performed by the horizontal selection section 134, the signals from the respective pixels transmitted through the respective vertical signal lines Lsig are sequentially outputted to the horizontal signal lines 135. The signals outputted to the horizontal signal lines 135 are transmitted to the outside of a substrate 11 via the horizontal signal lines 135.

The circuit part including the row scanning section 131, the horizontal selection section 133, the horizontal selection section 134, and the horizontal signal lines 135 may be formed directly on the substrate 11, or may be provided on an external control IC. Alternatively, the circuit part may be formed on another substrate that is connected to the substrate 11 with the use of a cable, etc.

The system control section 132 receives a clock supplied from the outside, data that instructs an operation mode, etc. Also, the system control section 132 outputs data such as internal information of the solid-state image pickup device 1. The system control section 132 further includes a timing generator that generates various timing signals. The system control section 132 controls drive of the peripheral circuits such as the row scanning section 131, the horizontal selection section 133, and the horizontal selection section 134, based on the various timing signals generated by the timing generator.

Application Example 1

The above-described solid-state image pickup device 1 is applicable to various types of electronic apparatuses that have an image pickup function. Examples of such electronic apparatuses may include camera systems such as digital still cameras and video camcorders, and mobile phones that have an image pickup function. FIG. 15 is a functional block diagram illustrating a general configuration of an image pickup apparatus (image pickup apparatus 2) according to Application example 1. The image pickup apparatus 2 may be, for example, a digital still camera or a digital video camcorder. The image pickup apparatus 2 may include an optical system 221, a shutter device 222, the solid-state image pickup device 1 (the pixel section 1a), a drive circuit 224, a signal process circuit 223, and a control section 225.

The optical system 221 leads image light (incident light) from a subject to the pixel section 1a in the solid-state image pickup device 1. The shutter device 222 controls a period of light illumination on the solid-state image pickup device 1 (exposure period) and a period of light shielding for the solid-state image pickup device 1. The drive circuit 224 performs open-close drive of the shutter device 222, and drives exposure operation and signal reading operation in the solid-state image pickup device 1 (the pixel section 1a). The signal process circuit 223 performs predetermined processes on output signals from the solid-state image pickup device 1. Examples of the predetermined processes may include various correction processes such as a demosaic process and a white balance adjustment process. The control section 225 may be configured, for example, of a microcomputer. The control section 225 controls shutter drive operation and image sensor drive operation of the drive circuit 224, and controls the signal process operation of the signal process circuit 223.

In the image pickup apparatus 2, when the incident light is received by the solid-state image pickup device 1 (the pixel section 1a) via the optical system 221 and the shutter device 222, signal electric charges based on an amount of the received light are accumulated in each pixel P. The drive circuit 224 reads the signal electric charges accumulated in each pixel P, and the read electric signals are outputted to the signal process circuit 223. The output signal outputted from the solid-state image pickup device 1 is subjected to a predetermined signal process in a signal process section 23, and may be outputted as an image signal Dout to the outside (for example, to a monitor), or may be held in a storage section (a storage medium) such as a memory which is not illustrated.

Application Examples 2-1 and 2-2

FIG. 16 is a functional block diagram illustrating a general configuration of an endoscopic camera (a capsule-type endoscopic camera 3A) according to Application example 2-1. The capsule-type endoscopic camera 3A includes an optical system 231, a shutter device 232, the solid-state image pickup device 1 (the pixel section 1a), a drive circuit 234, a signal process circuit 233, a data transmission section 235, a driving battery 236, and a gyro circuit 237 for sensing posture (such as directions and angles). Out of these components, the optical system 231, the shutter device 232, the drive circuit 234, and the signal process circuit 233 have functions similar to those of the optical system 221, the shutter device 222, the drive circuit 224, and the signal process circuit 223 that are described above for the image pickup apparatus 2. However, the optical system 231 may be desirably capable of picking up images in a plurality of azimuths (for example, in all azimuths) in a three-dimensional space. The optical system 231 is configured of one or a plurality of lenses. However, in the present example, an image signal D1 after being subjected to the signal process in the signal process circuit 233 and a posture sensing signal D2 outputted from the gyro circuit 237 are transmitted to an outside devices by wireless communication via the data transmission section 235.

The endoscopic camera to which the solid-state image pickup device 1 in the above-described embodiment is applicable is not limited to endoscopic cameras of a capsule-type as described above. Such an endoscopic camera may be, for example, an insertion-type endoscopic camera (an insertion-type endoscopic camera 3B) (Application example 2-2) as shown in FIG. 17. As with the configuration of part of the above-described capsule-type endoscopic camera 3A, the insertion-type endoscopic camera 3B includes the optical system 231, the shutter device 232, the solid-state image pickup device 1 (the pixel section 1a), the drive circuit 234, the signal process circuit 233, and the data transmission section 235. However, in the insertion-type endoscopic camera 3B is further provided with an arm 238a and a drive section 238. The arm 238a is stored inside the apparatus. The drive section 238 drives the arm 238a. Such an insertion-type endoscopic camera 3B is connected to a cable 239. The cable 239 includes a wiring 239A for transmitting an arm control signal CTL to the drive section 238, and a wiring 239B for transmitting an image signal Dout based on a picked-up image.

Application Example 3

FIG. 18 is a functional block diagram illustrating a general configuration of a vision chip (a vision chip 4) according to Application example 3. The vision chip 4 is an artificial retina that is used by being embedded in part of a wall (a retina E2 that has visual nerves) in back of an eyeball E1 of an eye. The vision chip 4 may be used by being embedded, for example, in part of one of a ganglion cell C1, a horizontal cell C2, and a visual cell C3 in the retina E2. The vision chip 4 may include, for example, the solid-state image pickup device 1, a signal process circuit 241, and a stimulation electrode section 242. Due to such a configuration, the vision chip 4 acquires, by the solid-state image pickup device 1, an electric signal based on light incident on the eye. The acquired electric signal is processed in the signal process circuit 241, and thereby, a predetermined control signal is supplied to the stimulation electrode section 242. The stimulation electrode section 242 has a function to supply stimulation (an electric signal) to the visual nerves in response to the inputted control signal.

Application Example 4

FIG. 19 is a functional block diagram illustrating a general configuration of a biosensor (a biosensor 5) according to Application example 4. The biosensor 5 may be, for example, a blood-glucose level sensor that is attachable to a finger A. The biosensor 5 includes a semiconductor laser 251, the solid-state image pickup device 1, and a signal process circuit 252. The semiconductor laser 51 may be, for example, an IR (infrared) laser that emits infrared light (with a wavelength of 780 nm or larger). Due to such a configuration, the biosensor 5 senses, with the use of the solid-state image pickup device 1, absorption degree of laser light in accordance with a glucose level in blood, and measures blood-glucose level.

The present disclosure has been described above referring to some embodiments and modifications, the content of the present disclosure is not limited to the above-described illustrative embodiments and the like, and may be variously modified. For example, in the above-described embodiments and the like, there is exemplified a device structure in which the two photodiodes 11A and 11B are laminated in the semiconductor substrate 21. However, for example, a photoelectric conversion element using an organic photoelectric conversion film may be laminated on the semiconductor substrate 21. Alternatively, the number of photodiodes to be formed in the semiconductor substrate 21 may be three or more, or may be one. The content of the present disclosure is applicable to any device that performs reading of signal electric charges from a photodiode with the use of a vertical transistor.

The above embodiments have been described referring to a solid-state image pickup device of a back illumination type as an example. However, the content of the present disclosure is also applicable to a solid-state image pickup device of a front illumination type.

It is possible to achieve at least the following configurations from the above-described example embodiments and the modifications of the disclosure.

(1)
A solid-state image pickup device, comprising:
a semiconductor substrate;
a photodiode formed in the semiconductor substrate;
a transistor having a gate electrode, at least a portion of the gate electrode being embedded in the semiconductor substrate, the transistor being configured to read a signal electric charge from the photodiode via the gate electrode; and
an electric charge transfer layer provided in contact with the gate electrode and the photodiode.

(2)
The solid-state image pickup device according to (1), wherein the photodiode is one of a plurality of photodiodes that are laminated in a thickness direction of the semiconductor substrate.

(3)
The solid-state image pickup device according to (1), wherein the photodiode includes a photoelectric conversion layer of a first conductivity type, and the electric charge transfer layer is an impurity diffusion layer of the first conductivity type connected to a portion of the photoelectric conversion layer.

(4)
The solid-state image pickup device according to (1), wherein
at least a portion of the gate electrode fills a concave section, the concave section being formed in the semiconductor substrate, and
at least a portion of the electric charge transfer layer is connected to the gate electrode at a bottom face of the concave section.

(5)
The solid-state image pickup device according to (4), wherein the electric charge transfer layer is formed adjacent to the bottom face of the concave section.

(6)
The solid-state image pickup device according to (4), further comprising a dark current suppression layer of a second conductivity type in contact with the electric charge transfer layer and the bottom face of the concave section.

(7)
The solid-state image pickup device according to (4), wherein the electric charge transfer layer covers the bottom face of the concave section and a portion of side faces of the concave section.

(8)
A method of manufacturing a solid-state image pickup device, the method, comprising:
forming a transistor having a gate electrode, at least a portion of the gate electrode being embedded in a semiconductor substrate that includes a photodiode, the transistor being configured to read a signal electric charge from the photodiode via the gate electrode; and forming an electric charge transfer layer in contact with the gate electrode and the photodiode.

(9)

The method according to (8), wherein the photodiode is one of a plurality of photodiodes that are laminated in a thickness direction of the semiconductor substrate.

(10)

The method according to (8), wherein the photodiode includes a photoelectric conversion layer of a first conductivity type, and the electric charge transfer layer is an impurity diffusion layer of the first conductivity type connected to a portion of the photoelectric conversion layer.

(11)

The method according to (8), wherein a concave section is formed in the semiconductor substrate during the forming of the transistor, and the gate electrode is formed to fill the concave section.

(12)

The method according to (11), wherein the electric charge transfer layer is formed by ion implantation through a bottom face of the concave section after forming the concave section and before forming the gate electrode.

(13)

The method according to (11), further comprising:

forming a dark current suppression layer of a second conductivity type by ion implantation through a bottom face of the concave section after forming the electric charge transfer layer and before forming the gate electrode, wherein the electric charge transfer layer is formed by ion plantation through the bottom face of the concave section after forming the concave section and before forming the gate electrode.

(14)

The method according to (11), wherein the electric charge transfer layer is formed by performing ion implantation through a selective region in the semiconductor substrate after forming the photodiode and before forming the concave section.

(15)

An electronic apparatus with a solid-state image pickup device according to (1).

(16)

A method for driving a solid-state image pickup device, the solid-state image pickup device comprising:

a semiconductor substrate;

a first photodiode formed in the semiconductor substrate;

a second photodiode formed in the semiconductor substrate;

a transistor having a gate electrode, at least a portion of the gate electrode being embedded in the semiconductor substrate; and a floating diffusion region embedded in the semiconductor substrate;

wherein a first charge of the first photodiode is transferred through the gate electrode to the floating diffusion, and a second charge of the second photodiode is transferred through the gate electrode to the floating diffusion region.

(17)

The method according to (16), wherein the photodiode is one of a plurality of photodiodes that are laminated in a thickness direction of the semiconductor substrate.

(18)

The method according to (16), wherein the photodiode includes a photoelectric conversion layer of a first conductivity type, and an electric charge transfer layer is an impurity diffusion layer of the first conductivity type connected to a portion of the photoelectric conversion layer.

(19)

The method according to (16), wherein a concave section is formed in the semiconductor substrate during the forming of the transistor, and the gate electrode is formed to fill the concave section.

(20)

The method according to (19), wherein an electric charge transfer layer is formed by ion implantation through a bottom face of the concave section after forming the concave section and before forming the gate electrode.

It should be understood by those skilled in the art that various modifications, combinations, sub-combinations, and alterations may occur depending on design requirements and other factors insofar as they are within the scope of the appended claims or the equivalents thereof.

REFERENCE SIGNS LIST 1 solid-state image pickup device
11A, 11B photodiode
21 semiconductor substrate
12 FD
13 electric charge transfer layer
13a dark current suppression layer
14 gate electrode
Tr vertical transistor
H concave section
Sb bottom face
S1 circuit formation face
S2 light receiving face

What is claimed:

1. An image pickup device, comprising:
   a photoelectric conversion region formed in a semiconductor substrate;
   a transistor having a gate electrode, a part of the gate electrode being embedded in the semiconductor substrate; and
   a first region of a first conductivity type in the semiconductor substrate;
   wherein the first region is disposed between the part of the gate electrode embedded in the semiconductor substrate and the photoelectric conversion region in a depth direction of the semiconductor substrate, and
   wherein the first region is coupled to the photoelectric conversion region.

2. The image pickup device according to claim 1, wherein the photoelectric conversion region is one of a plurality of photoelectric conversion regions that are positioned in the depth direction of the semiconductor substrate.

3. The image pickup device according to claim 2, wherein the gate electrode fills a concave section in the semiconductor substrate, and further comprising:
   a second region of a second conductivity type that is in contact with the first region and a bottom face of the concave section.

4. The image pickup device according to claim 3, wherein the first region is adjacent to the bottom face of the concave section and a portion of side faces of the concave section.

5. The image pickup device according to claim 1, wherein the photoelectric conversion region has the first conductivity type, and the first region is an impurity diffusion layer of the first conductivity type connected to a portion of the photoelectric conversion region.

6. The image pickup device according to claim 1, wherein the first conductivity type is n-type.

7. The image pickup device according to claim 1, wherein the first region serves as a transfer path of signal electric charges and serves as an additional photoelectric conversion region.

8. The image pickup device according to claim 1, wherein the part of the gate electrode embedded in the semiconductor substrate is covered with an insulating film.

9. The image pickup device according to claim 8, wherein the first region is coupled to the insulating film.

10. The image pickup device according to claim 1, wherein the gate electrode fills a concave section in the semiconductor substrate.

11. The image pickup device according to claim 10, further comprising:
a second region of a second conductivity type that is in contact with the first region and a bottom face of the concave section.

12. The image pickup device according to claim 10, wherein the first region is adjacent to a bottom face of the concave section and a portion of side faces of the concave section.

13. The image pickup device according to claim 10, further comprising:
a floating diffusion adjacent to a first end of the gate electrode, wherein the first end is opposite from a bottom face of the concave section.

14. The image pickup device according to claim 13, wherein the first region is a part of a transfer path of signal electric charges from the photoelectric conversion region to the gate electrode and the floating diffusion.

15. The image pickup device according to claim 10, wherein the first region is self-aligned and adjacent to a bottom face of the concave section.

16. The image pickup device according to claim 15, wherein the first region has a desired thickness based on a predetermined set dose amount in ion implantation and injection energy.

17. The image pickup device according to claim 10, wherein the first region has a desired thickness based on a predetermined set dose amount in ion implantation and injection energy.

18. The image pickup device according to claim 15, wherein defects that occur caused by a potential dip are reduced when transferring a signal electric charge through the first region based on a location of the first region in relation to the bottom face.

19. The image pickup device according to claim 18, wherein a position that is a reference for the bottom face is set as a shallower position than a depth of the concave section in advance of forming the concave section.

20. The image pickup device according to claim 1, further comprising:
a second region of a second conductivity type, wherein the second region is disposed between the part of the gate electrode and the first region, and wherein the second region is coupled to the first region.

21. The image pickup device according to claim 20, wherein the first conductivity type is n-type and the second conductivity type is p-type.

22. The image pickup device according to claim 20, wherein the part of the gate electrode embedded in the semiconductor substrate is covered with an insulating film.

23. The image pickup device according to claim 22, wherein the second region is coupled to the insulating film.

24. The image pickup device according to claim 1, wherein the gate electrode fills a concave section in the semiconductor substrate and wherein the first region serves as a transfer path of signal electric charges to the gate electrode.

25. The image pickup device according to claim 1,
wherein a plurality of photoelectric conversion regions comprises the photoelectric conversion region and a secondary photoelectric conversion region, the secondary photoelectric conversion region being located adjacent to the gate electrode, and a length of the photoelectric conversion region is greater than a length of the secondary photoelectric conversion region, and
wherein the length of the photoelectric conversion region and the length of the secondary of the photoelectric conversion region are measured in a direction perpendicular to the depth direction of the semiconductor substrate.

26. The image pickup device according to claim 1,
wherein a plurality of photoelectric conversion regions comprises the photoelectric conversion region and a secondary photoelectric conversion region, and wherein the secondary photoelectric conversion region receives light that has passed through the photoelectric conversion region.

27. The image pickup device according to claim 26,
wherein a length of the photoelectric conversion region is greater than a length of the secondary photoelectric conversion region, and the length of the photoelectric conversion region and the length of the secondary photoelectric conversion region are measured in a direction perpendicular to the depth direction of the semiconductor substrate.

28. The image pickup device according to claim 1, wherein the first region has a first width in a direction perpendicular to the depth direction of the semiconductor substrate, and the photoelectric conversion region has a second width in the direction perpendicular to the depth direction of the semiconductor substrate, and wherein the second width is longer than the first width.

29. An image pickup device, comprising:
a photoelectric conversion region formed in a semiconductor substrate;
a transistor having a gate electrode, a part of the gate electrode being embedded in the semiconductor substrate;
a first region of a first conductivity type in the semiconductor substrate;
wherein the first region is disposed between the part of the gate electrode embedded in the semiconductor substrate and the photoelectric conversion region,
wherein the first region is coupled to the photoelectric conversion region,
wherein the gate electrode fills a concave section in the semiconductor substrate, and
wherein the first region serves as a transfer path of signal electric charges to the gate electrode; and
a second region of a second conductivity type that is in contact with the first region and a bottom face of the concave section.

30. The image pickup device according to claim 29, wherein the first region is adjacent to the bottom face of the concave section and a portion of side faces of the concave section.

31. An electronic apparatus, comprising:
a signal processing circuit;
an optical system; and
an image pickup device, comprising:
- a photoelectric conversion region formed in a semiconductor substrate;
- a transistor having a gate electrode, a part of the gate electrode being embedded in the semiconductor substrate; and
- a first region of a first conductivity type in the semiconductor substrate;
- wherein the first region is disposed between the part of the gate electrode embedded in the semiconductor substrate and the photoelectric conversion region in a depth direction of the semiconductor substrate, and
- wherein the first region is coupled to the photoelectric conversion region.

* * * * *